US012677714B2

(12) United States Patent
Tajiri

(10) Patent No.: US 12,677,714 B2
(45) Date of Patent: Jul. 7, 2026

(54) SEMICONDUCTOR DEVICE INCLUDING A SUBSTRATE TO WHICH A LEAD IS FIXED

(71) Applicant: ROHM CO., LTD., Kyoto (JP)

(72) Inventor: Hiroyuki Tajiri, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 401 days.

(21) Appl. No.: 18/272,103

(22) PCT Filed: Jan. 20, 2022

(86) PCT No.: PCT/JP2022/001961
§ 371 (c)(1),
(2) Date: Jul. 13, 2023

(87) PCT Pub. No.: WO2022/168618
PCT Pub. Date: Aug. 11, 2022

(65) Prior Publication Data
US 2024/0071875 A1     Feb. 29, 2024

(30) Foreign Application Priority Data

Feb. 3, 2021     (JP) ................................. 2021-015729

(51) Int. Cl.
*H10W 90/00*          (2026.01)
*H10W 70/40*          (2026.01)
(Continued)

(52) U.S. Cl.
CPC ........ *H10W 90/811* (2026.01); *H10W 70/429* (2026.01); *H10W 72/07355* (2026.01);
(Continued)

(58) Field of Classification Search
CPC ............. H01L 23/495; H01L 23/49517; H01L 23/49524; H01L 23/49531;
(Continued)

(56) References Cited

U.S. PATENT DOCUMENTS

2006/0113664 A1* 6/2006 Shiraishi ................. H01L 24/40
                                                            257/E23.047
2009/0001554 A1* 1/2009 Otremba ........... H01L 23/49575
                                                            438/107
(Continued)

FOREIGN PATENT DOCUMENTS

JP          H05304239 A     11/1993
JP          2004349397 A    12/2004
(Continued)

OTHER PUBLICATIONS

International Search Report and Written Opinion mailed on Apr. 12, 2022, received for PCT Application PCT/JP2022/001961, filed on Jan. 20, 2022, 9 pages including English Translation.
(Continued)

*Primary Examiner* — Scott B Geyer
(74) *Attorney, Agent, or Firm* — XSENSUS LLP

(57)          ABSTRACT

A semiconductor device, includes: a substrate having an obverse surface facing in a thickness direction; a first lead having a loading surface facing a side same as a side the obverse surface faces as to the thickness direction and being fixed on the obverse surface; and a first semiconductor element arranged on the loading surface. A dimension of the substrate in a first direction orthogonal to the thickness direction is larger than a dimension of the substrate in a second direction orthogonal to the thickness direction and the first direction. The first lead includes a first region overlapped with the first semiconductor element as viewed in the thickness direction and a second region separated from the first semiconductor element as viewed in the thickness direction, and at least a part of the second region extends along the second direction.

19 Claims, 20 Drawing Sheets

(51) Int. Cl.

| | |
|---|---|
| *H10W 72/00* | (2026.01) |
| *H10W 72/30* | (2026.01) |
| *H10W 72/50* | (2026.01) |
| *H10W 72/59* | (2026.01) |
| *H10W 72/90* | (2026.01) |
| *H10W 74/10* | (2026.01) |

(52) U.S. Cl.

CPC .. *H10W 72/07552* (2026.01); *H10W 72/3528* (2026.01); *H10W 72/527* (2026.01); *H10W 72/5449* (2026.01); *H10W 72/5522* (2026.01); *H10W 72/59* (2026.01); *H10W 72/884* (2026.01); *H10W 72/952* (2026.01); *H10W 74/111* (2026.01); *H10W 90/755* (2026.01)

(58) Field of Classification Search

CPC ......... H01L 23/49541; H01L 23/49548; H01L 23/49551; H01L 23/49555; H01L 23/49575; H01L 24/32; H01L 24/48; H01L 24/49; H01L 24/73; H01L 23/3107; H01L 25/16; H01L 25/072; H01L 24/26; H01L 2224/26–33519; H01L 2224/83–83986; H10D 30/63; H10D 84/016; H10D 84/0195; H10D 30/0291–0297; H10D 30/66–669; H10D 84/0114; H10D 84/0121; H10D 84/406; H10D 84/613–617; H10D 84/63; H10D 84/641–643; H10D 10/40–461; H10D 10/821–891; H10D 12/032–038; H10D 12/441–491

See application file for complete search history.

(56) References Cited

U.S. PATENT DOCUMENTS

| | | | | |
|---|---|---|---|---|
| 2009/0174046 A1* | 7/2009 | Liu | ..................... | H01L 23/3107 |
| | | | | 257/676 |
| 2010/0133667 A1* | 6/2010 | Oka | .................. | H01L 23/49517 |
| | | | | 257/666 |
| 2014/0145193 A1* | 5/2014 | Kadoguchi | ......... | H10W 40/778 |
| | | | | 257/48 |
| 2014/0159054 A1* | 6/2014 | Otake | ................... | H10W 76/15 |
| | | | | 257/77 |
| 2014/0284784 A1* | 9/2014 | Yasunaga | ................ | H01L 23/52 |
| | | | | 257/690 |

| | | | | |
|---|---|---|---|---|
| 2015/0340350 A1* | 11/2015 | Koga | .................. | H01L 23/3735 |
| | | | | 257/713 |
| 2016/0073535 A1* | 3/2016 | Wu | ................... | H01L 23/49844 |
| | | | | 361/728 |
| 2016/0247792 A1* | 8/2016 | Chang | .................. | H10W 70/20 |
| 2017/0077068 A1* | 3/2017 | Horio | ................. | H10W 40/255 |
| 2017/0263516 A1* | 9/2017 | Ishimaru | .............. | H10W 70/68 |
| 2017/0294373 A1* | 10/2017 | Rowden | ................ | H10W 72/00 |
| 2018/0040540 A1* | 2/2018 | Kasuya | ............ | H01L 23/49568 |
| 2018/0047649 A1* | 2/2018 | Bando | .............. | H01L 23/49513 |
| 2018/0102302 A1* | 4/2018 | Grassmann | ........ | H10W 40/255 |
| 2018/0286775 A1* | 10/2018 | Kamata | .............. | H10W 40/255 |
| 2019/0006258 A1* | 1/2019 | Muto | ................. | H01L 23/4006 |
| 2019/0006270 A1* | 1/2019 | Niu | ................... | H01L 23/49562 |
| 2019/0189553 A1* | 6/2019 | Hohlfeld | .............. | H01L 25/072 |
| 2019/0214335 A1* | 7/2019 | Rozbicki | ................ | H01L 24/49 |
| 2019/0221506 A1* | 7/2019 | Yeo | ....................... | H01L 21/561 |
| 2020/0098673 A1* | 3/2020 | Kawashima | ........ | H10W 90/811 |
| 2020/0161145 A1* | 5/2020 | Mafune | ................. | H02M 7/003 |
| 2020/0176424 A1* | 6/2020 | Michikoshi | ....... | H01L 23/49531 |
| 2021/0082781 A1* | 3/2021 | Yamada | ............. | H10W 40/258 |
| 2021/0143147 A1* | 5/2021 | Nakano | .............. | H10D 62/8325 |
| 2021/0159152 A1* | 5/2021 | Hong | .............. | H01L 23/49575 |
| 2021/0167005 A1* | 6/2021 | Nakata | ............... | H10W 70/658 |
| 2021/0287968 A1* | 9/2021 | Tanaka | ............... | H01L 23/3737 |
| 2021/0327779 A1* | 10/2021 | Sakumoto | .......... | H10W 74/127 |
| 2021/0384097 A1* | 12/2021 | Wu | ..................... | H01L 23/4928 |
| 2021/0398950 A1* | 12/2021 | Nakata | ................. | H10W 90/00 |
| 2023/0090004 A1* | 3/2023 | Nakamura | ......... | H01L 23/3735 |
| | | | | 257/666 |
| 2023/0178461 A1* | 6/2023 | Hama | .................... | H01L 24/32 |
| | | | | 257/666 |

FOREIGN PATENT DOCUMENTS

| | | | |
|---|---|---|---|
| JP | 2007305671 A | 11/2007 |
| JP | 2009-158787 A | 7/2009 |
| JP | 2014-207430 A | 10/2014 |
| JP | 2015106609 A | 6/2015 |
| JP | 2018116995 A | 7/2018 |
| JP | 2020102523 A | 7/2020 |
| WO | 2019167284 A1 | 9/2019 |

OTHER PUBLICATIONS

Office Action issued on Oct. 7, 2025 in corresponding Japanese patent application No. 2022-579433 (11 pages; with English translation).

Office Action mailed Jan. 20, 2026 in corresponding Japanese patent application No. JP2022-579433 (6 pages; with English translation).

\* cited by examiner

SEMICONDUCTOR DEVICE INCLUDING A SUBSTRATE TO WHICH A LEAD IS FIXED

CROSS-REFERENCE TO RELATED APPLICATIONS

The present application is based on PCT filing PCT/JP2022/001961, filed Jan. 20, 2022, which claims priority to Japanese Patent Application No. 2021-015729, filed Feb. 3, 2021, the entire disclosure of each is incorporated herein by reference.

TECHNICAL FIELD

The present disclosure relates to a semiconductor device provided with a substrate to which a lead is fixed and a semiconductor element loaded on the lead.

BACKGROUND ART

Patent Document 1 discloses an example of a semiconductor device. The semiconductor device is provided with an insulating substrate, a metal pattern fixed to the insulating substrate, and a semiconductor element loaded on to the metal pattern.

On the semiconductor device disclosed by Patent Document 1, in the case where the metal pattern is a lead, the metal pattern may be fixed to the insulating substrate by using a bonding layer such as solder. When fixing the metal pattern to the insulating substrate, the bonding layer needs to be melted by heat. This time, thermal strain occurs on the interface between the insulating substrate and the metal pattern due to a difference of linear expansion coefficients of the insulating substrate and the metal pattern. Thus, thermal stress occurs on the insulating substrate. When this thermal stress is concentrated, there is a fear that a crack is generated on the insulating substrate. Therefore, in the case where the metal pattern is a lead, it is desirable to take measures for reducing the thermal strass concentration that acts on the insulating substrate in order to prevent the generation of a crack on the insulating substrate.

PRIOR ART DOCUMENTS

Patent Document

Patent Document 1: JP-A-2009-158787

SUMMARY OF INVENTION

Problem to be Solved by Invention

Considering the issues as above, an object of the present disclosure is to provide a semiconductor device capable of reducing concentration of thermal stress acting on a substrate to which a lead is fixed.

Means to Solve the Problem

Provided by a first aspect of the present disclosure, a semiconductor device, includes: a substrate having an obverse surface facing in a thickness direction; a first lead having a loading surface facing a side same as a side the obverse surface faces as to the thickness direction and being fixed on the obverse surface; and a first semiconductor element arranged on the loading surface. A dimension of the substrate in a first direction orthogonal to the thickness direction is larger than a dimension of the substrate in a second direction orthogonal to the thickness direction and the first direction. The first lead includes a first region overlapped with the first semiconductor element as viewed in the thickness direction and a second region separated from the first semiconductor element as viewed in the thickness direction, and at least a part of the second region extends along the second direction. A thickness of the second region is smaller than a thickness of the first region.

Advantages of Invention

According to the above configuration, it becomes possible on a semiconductor device to reduce concentration of thermal stress acting on a substrate to which a lead is fixed.

The other features and benefits of the present disclosure will be more apparent by the detailed explanations given below based on the accompanying drawings.

BRIEF DESCRIPTION OF DRAWINGS

FIG. 19 is a plan view of the semiconductor device according to the second embodiment of the present disclosure, in which the sealing resin is depicted as being transparent.

MODE FOR CARRYING OUT THE INVENTION

Embodiments for carrying out the present disclosure are explained with reference to the accompanying drawings.

Figure 1:
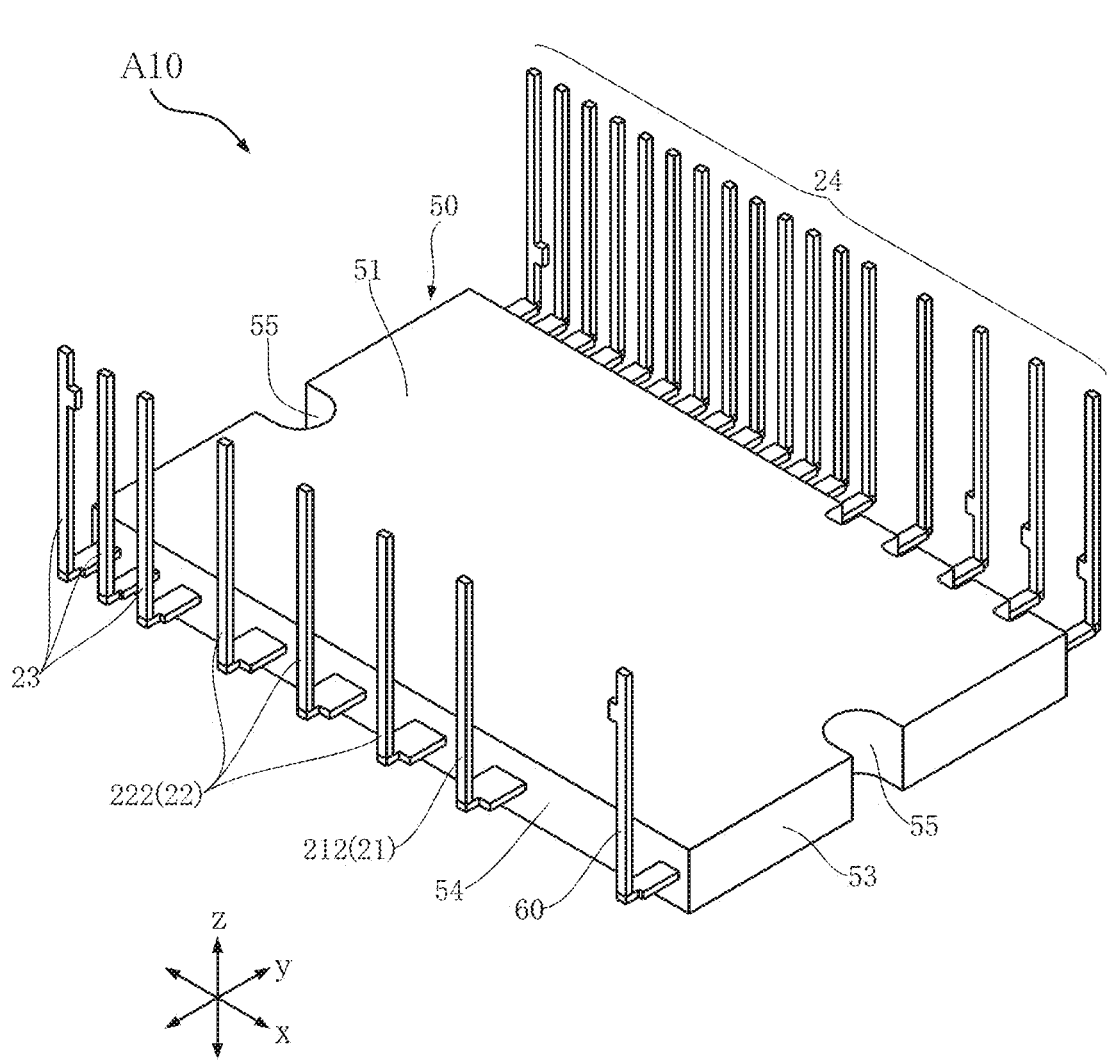
FIG. 1 is a perspective view of a semiconductor device according to the first embodiment of the present disclosure.
Figure 2:
FIG. 2 is a plan view of the semiconductor device of FIG. 1.
Figure 3:
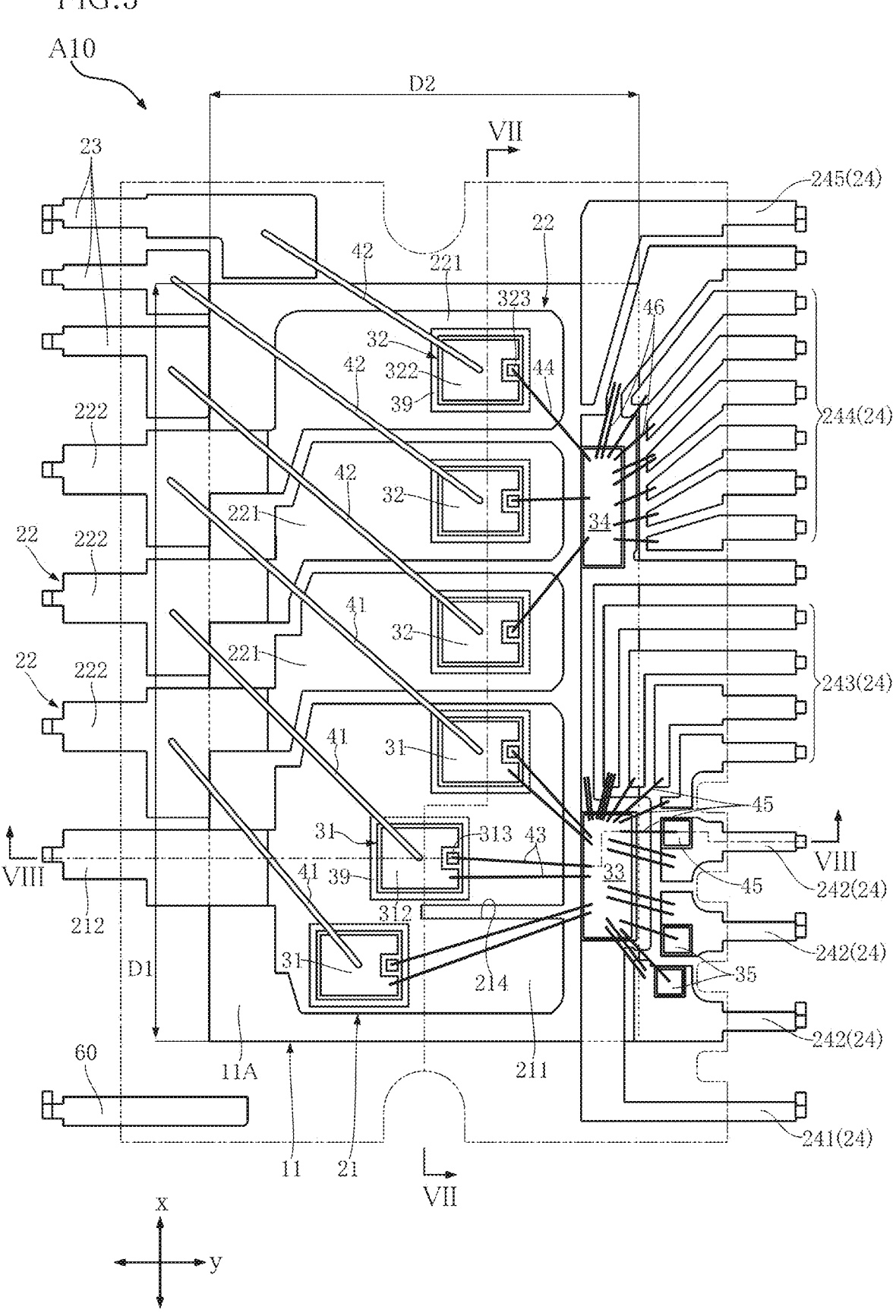
FIG. 3 is a plan view corresponding to FIG. 2, in which sealing resin is depicted as being transparent.

Based on FIGS. 1-13, a semiconductor device A10 according to the first embodiment of the present disclosure is explained. The semiconductor device A10 is provided with a substrate 11, a base layer 12, a bonding layer 13, a first lead 21, a plurality of second leads 22, a plurality of third leads 23, a plurality of first semiconductor elements 31, a plurality of second semiconductor elements 32, a conductive bonding layer 39, a plurality of first wires 41, a plurality of second wires 42, and a sealing resin 50. Further, the semiconductor device A10 is provided with a plurality of driver leads 24, a first driver 33, a second driver 34, a plurality of diodes 35, a plurality of third wires 43, a plurality of fourth wires 44, a plurality of fifth wires 45, a plurality of sixth wires 46, and a dummy lead 60. Here, in FIG. 3, the sealing resin 50 is depicted as being transparent for ease of understanding. In FIG. 3, the sealing resin 50 depicted as being transparent is drawn by an imaginary line (a two-dot chain line). In FIG. 3, VII-VII line and VIII-VIII line are drawn by a dashed line respectively.

In the explanation of the semiconductor device A10, a thickness direction of the substrate 11 is referred to as the "thickness direction z" for convenience's sake. A direction which is orthogonal to the thickness direction z is referred to as the "first direction x". A direction which is orthogonal to both of the thickness direction z and the first direction x is referred to as the "second direction y".

The semiconductor device A10 converts a DC power supply voltage applied to the first lead 21 and the third lead 23 into an AC power by the plurality of first semiconductor elements 31 and the plurality of second semiconductor elements 32. The converted AC power is output from the plurality of second leads 22 as three phases (a U phase, a V phase, and a W phase) that are different from one another. Further, as the semiconductor device A10 is provided with a first driver 33 for driving the plurality of first semiconductor elements 31, and a second driver 34 for driving the plurality of second semiconductor elements 32, the semiconductor device A10 is an IPM (Intelligent Power Module). The semiconductor device A10 is used for a power supply circuit for the three-phase AC motor driving, for example.

Figure 4:
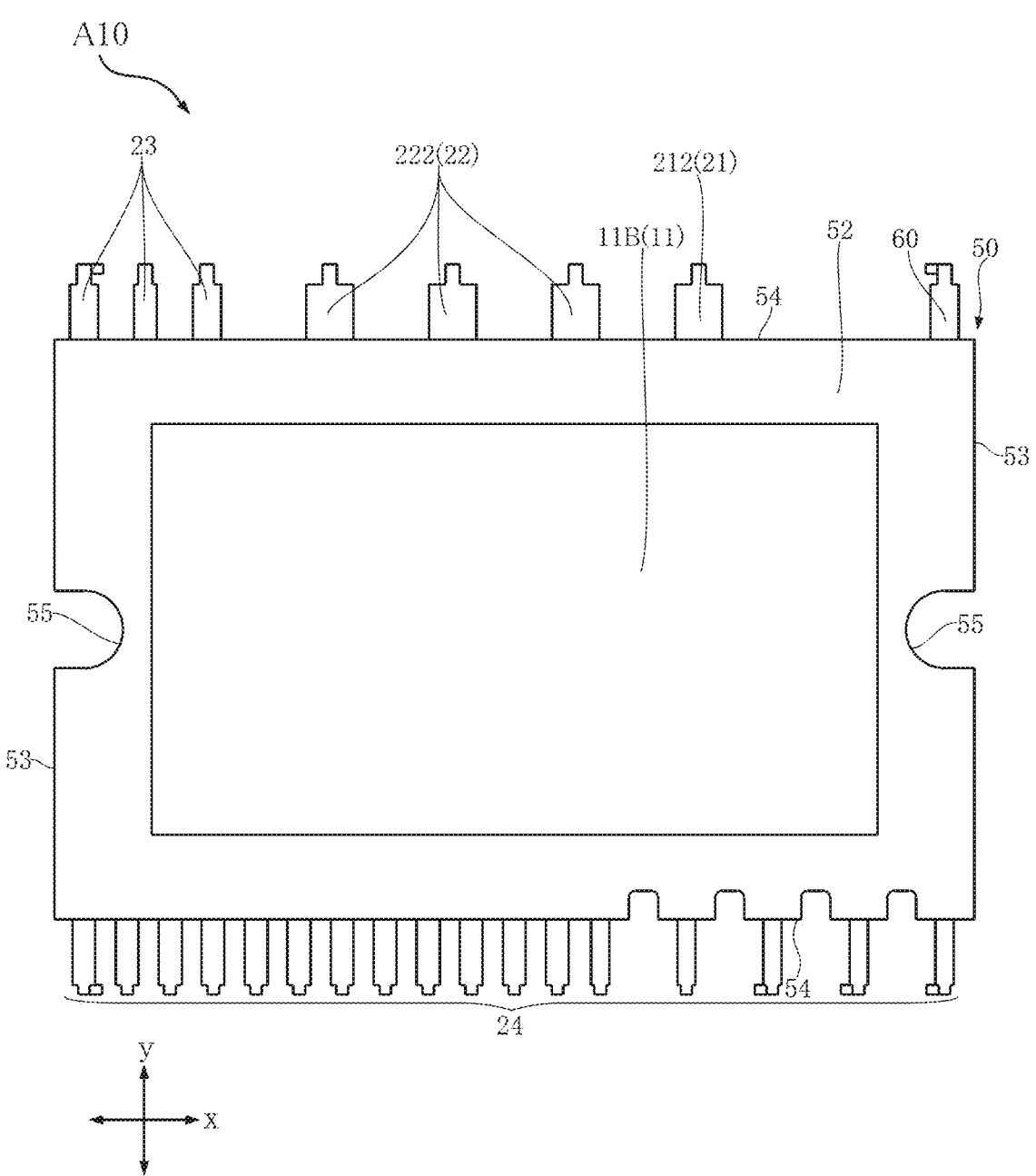
FIG. 4 is a bottom view of the semiconductor device of FIG. 1.
Figure 7:
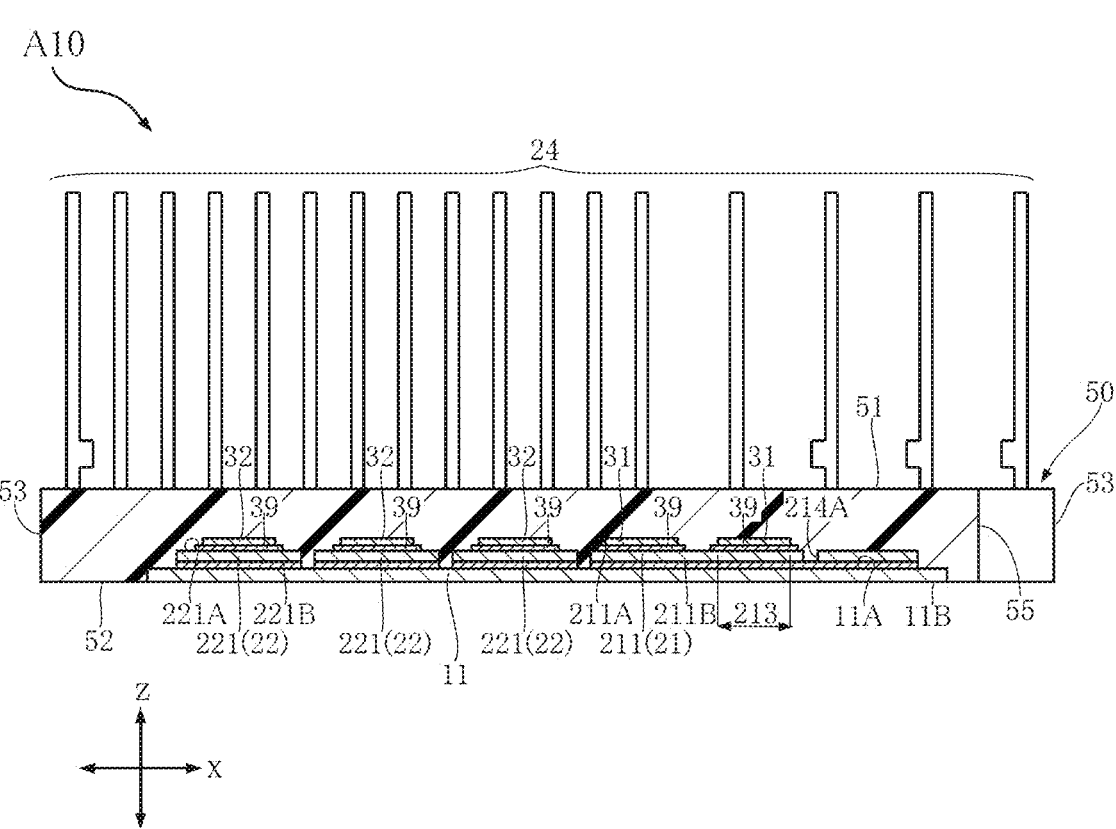
FIG. 7 shows a cross section taken along VII-VII line of FIG. 3.
Figure 8:
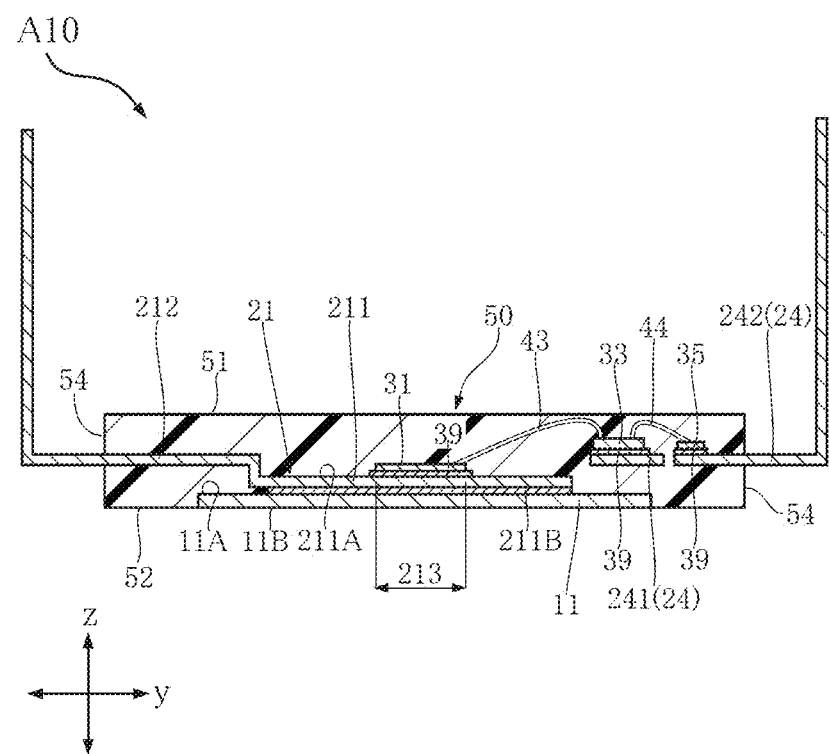
FIG. 8 shows a cross section taken along VIII-VIII line of FIG. 3.

As shown in FIGS. 3 and 7, the substrate 11 supports the first lead 21 and the plurality of second leads 22. The substrate 11 has an electrically insulating property. The substrate 11 is made of ceramic containing, for example, alumina ($Al_2O_3$). As a material of the substrate 11, those having a relatively high heat conductivity are preferable. As shown in FIG. 7, the substrate 11 has an obverse surface 11A and a reverse surface 11B. The obverse surface 11A faces in the thickness direction z. The reverse surface 11B faces a side opposite to a side the obverse surface 11A faces as to the thickness direction z. As shown in FIGS. 4, 7 and 8, the substrate 11 is covered by the sealing resin 50, except for the reverse surface 11B.

As shown in FIG. 3, a first dimension D1 of the substrate 11 in the first direction x is larger than a second dimension D2 of the substrate 11 in the second direction y. Therefore, the first direction x corresponds to the longitudinal direction of the substrate 11.

Figure 10:
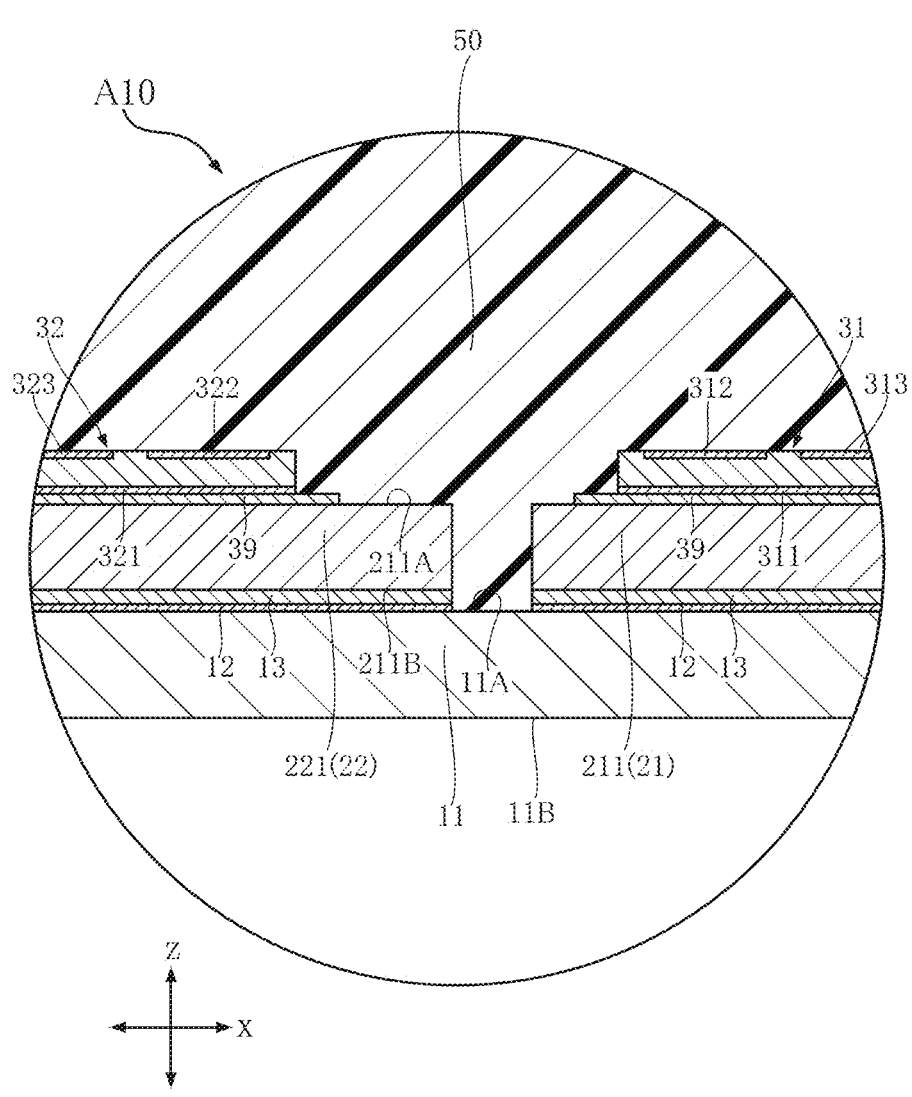
FIG. 10 shows a cross section taken along X-X line of FIG. 9.

As shown in FIG. 10, the base layer 12 is laminated on the obverse surface 11A of the substrate 11. The base layer 12 contains a metallic element. The metallic element is silver (Ag). An example of the base layer 12 is what is made by baking silver resinate paste applied to the obverse surface 11A.

As shown in FIG. 10, the bonding layer 13 is laminated on the base layer 12. The bonding layer 13 bonds the base layer 12 and the first lead 21 and the plurality of second leads 22. The bonding layer 13 contains a metallic element. The metallic element is tin (Sn). The bonding layer 13 is a lead-free solder containing an alloy of tin and antimony (Sn), for example.

The first lead 21, the plurality of second leads 22, and the plurality of third leads 23 are constituted by the same lead frame together with the plurality of driver leads 24 and a dummy lead 60. The lead frame is copper (Cu) or copper alloy. As such, compositions of the first lead 21, the plurality of second leads 22, the plurality of third leads 23, the plurality of driver leads 24, and the dummy lead 60 include copper (Cu). In other words, those leads contain copper.

Figure 5:
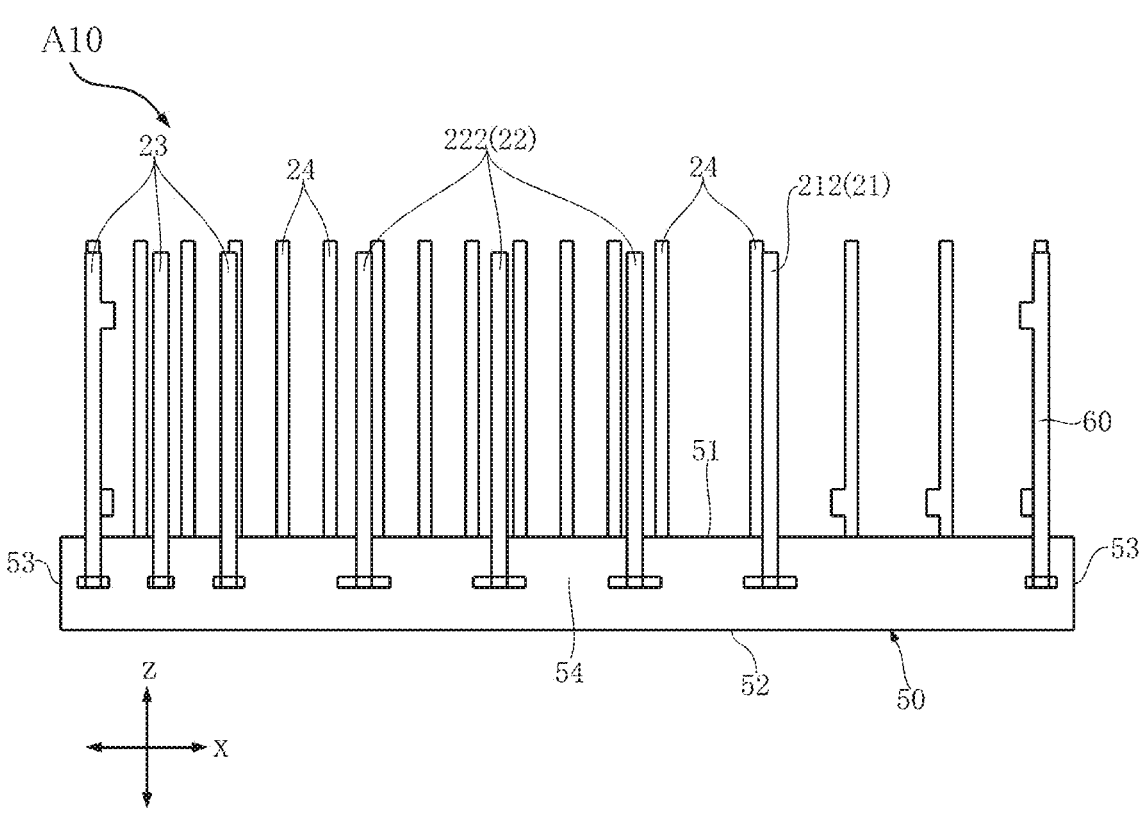
FIG. 5 is a front view of the semiconductor device of FIG. 1.

As shown in FIGS. 3, 7, and 8, the first lead 21 is fixed on the obverse surface 11A of the substrate 11. The first lead 21 has a pad portion 211 and a terminal portion 212. The pad portion 211 carries the plurality of first semiconductor elements 31. The pad portion 211 has a loading surface 211A and an opposing surface 211B. The loading surface 211A faces a side the same as a side the obverse surface 11A faces as to the thickness direction z. The opposing surface 211B faces a side opposite to a side the loading surface 211A faces as to the thickness direction z. The opposing surface 211B is opposed to the obverse surface 11A. As shown in FIG. 10, the opposing surface 211B is in contact with the bonding layer 13. The pad portion 211 is fixed to the obverse surface 11A with an intervention of the base layer 12 and the bonding layer 13. The pad portion 211 is covered by the sealing resin 50. The terminal portion 212 is connected to the pad portion 211. As shown in FIGS. 2, 4, and 5, a part of the terminal portion 212 is exposed out of the sealing resin 50. As to the semiconductor device A10, the terminal portion 212 corresponds to a p-terminal (a positive terminal) to which the DC power supply voltage as the subject of the power conversion is applied.

As shown in FIGS. 3 and 7, the plurality of second leads 22 are separated from the first lead 21, and are fixed on the obverse surface 11A of the substrate 11. The plurality of second leads 22 are located adjacent to the first lead 21 in the first direction x, and are aligned along the first direction x. Each of the plurality of second leads 22 has a pad portion 221 and a terminal portion 222. The pad portions 221 of the plurality of second leads 22 individually carry a second semiconductor element 32. As viewed in the thickness direction z, the size of a pad portion 221 is smaller than the size of the pad portion 211 of the first lead 21. The pad portion 221 has a loading surface 221A and an opposing surface 221B. The loading surface 221A faces a side the same as a side the obverse surface 11A faces as to the thickness direction z. The opposing surface 221B faces a side opposite to a side the loading surface 221A faces as to the thickness direction z. The opposing surface 221B is opposed to the obverse surface 11A. As shown in FIG. 10, the opposing surface 221B is in contact with the bonding layer 13. The pad portion 221 is fixed to the obverse surface 11A with an intervention of the base layer 12 and the bonding layer 13. The pad portion 221 is covered by the sealing resin 50. The terminal portion 222 is connected to the pad portion 221. As shown in FIGS. 2, 4, and 5, a part of the terminal portion 222 is exposed out of the sealing resin 50. As to the semiconductor device A10, a three-phase AC power is output from the terminal portions 212 of the plurality of second leads 22.

As shown in FIG. 3, the plurality of third leads 23 are separated from the first lead 21 and the plurality of second leads 22. The plurality of third leads 23 are on a side opposite to a side the first lead 21 is located with respect to the plurality of second leads 22 as to the first direction x. The plurality of third leads 23 are supported by the sealing resin 50, not the substrate 11. As shown in FIGS. 2, 4, and 5, a part of each of the plurality of third leads 23 is exposed out of the sealing resin 50. As to the semiconductor device A10, the plurality of third leads 23 are N-terminals (negative terminals) to which the DC power supply voltage as the subject of the power conversion is applied.

As shown in FIGS. 3 and 7, the plurality of first semiconductor elements 31 are arranged on the loading surface 211A of the pad portion 211 of the first lead 21. As shown in FIGS. 3 and 7, the plurality of second semiconductor elements 32 are separately arranged on the loading surfaces 221A of the pad portions 221 of the plurality of second leads 22. The plurality of first semiconductor elements 31 and the plurality of second semiconductor elements 32 are the same semiconductor elements. The plurality of first semiconductor elements 31 and the plurality of second semiconductor elements 32 are, for example, MOSFETs (Metal-Oxide-Semiconductor Field-Effect Transistors). The MOSFETs are of n-channel type, and have a vertical-type structure. Each of the plurality of first semiconductor elements 31 and the plurality of second semiconductor elements 32 includes a compound semiconductor substrate. The compound semiconductor substrate contains silicon carbide (SiC).

Figure 9:
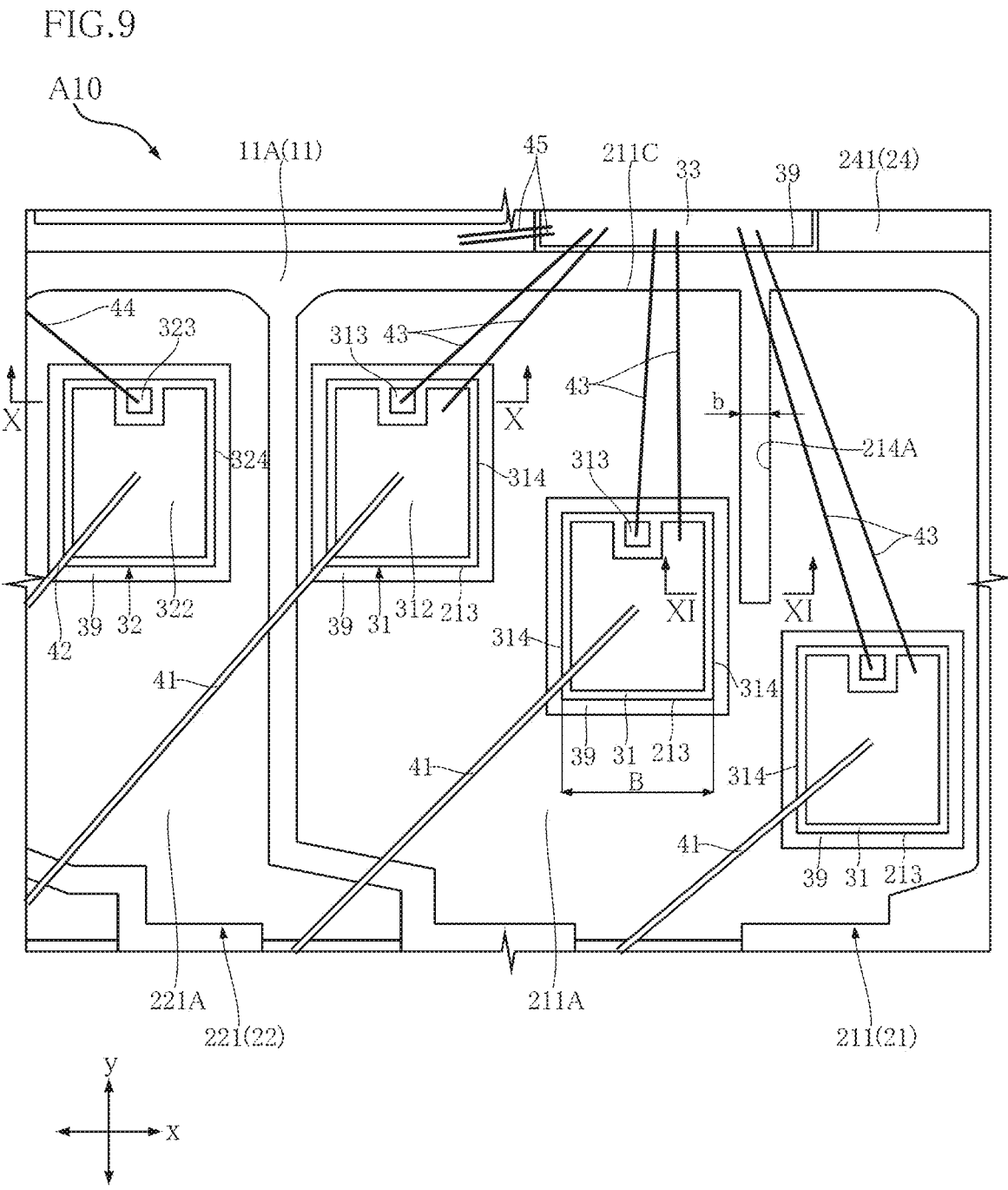
FIG. 9 is a partial enlarged view of FIG. 3.

As shown in FIGS. 9 and 10, each of the plurality of first semiconductor elements 31 has a first electrode 311, a second electrode 312, a gate electrode 313, and a first peripheral edge 314. As shown in FIG. 10, the first electrode 311 is opposed to the loading surface 211A of the pad portion 211 of the first lead 21. To the first electrode 311, a voltage corresponding to the power before the conversion by the first semiconductor element 31 is applied. That is, the first electrode 311 corresponds to a drain electrode of the first semiconductor element 31.

As shown in FIG. 10, the second electrode 312 is located on a side opposite to a side the first electrode 311 is located as to the thickness direction z. To the second electrode 312, a voltage corresponding to the power after the conversion by the first semiconductor element 31 is applied. That is, the second electrode 312 corresponds to a source electrode of the first semiconductor element 31. The second electrode 312 includes a plurality of metal plating layers. The second electrode 312 includes a nickel (Ni) plating layer and a gold (Au) plating layer laminated on the nickel plating layer. Otherwise, the second electrode 312 may be configured to include the nickel plating layer, a palladium (Pd) plating layer laminated on the nickel plating layer and a gold plating layer laminated on the palladium plating layer.

As shown in FIGS. 9 and 10, the gate electrodes 313 are arranged on a side the same as a side the second electrode 312 is located as to the thickness direction z, and is separated from the second electrode 312. To the gate electrodes 313, a gate voltage for driving the first semiconductor element 31 is applied. As viewed in the thickness direction z, the size of the gate electrodes 313 is smaller than a size of the second electrode 312.

As shown in FIG. 9, the first peripheral edge 314 extends along the second direction y as viewed in the thickness direction z. At each of the plurality of first semiconductor elements 31, the first peripheral edge 314 includes a pair of sections separated from each other in the first direction x.

As shown in FIGS. 9 and 10, each of the plurality of second semiconductor elements 32 has a first electrode 321, a second electrode 322, a gate electrode 323, and a second peripheral edge 324. As shown in FIG. 10, the first electrode 321 is opposed to the loading surface 221A of the pad portion 221 of one of the plurality of second leads 22. To the first electrode 321, a voltage corresponding to the power before the conversion by the second semiconductor element 32 is applied. That is, the first electrode 321 corresponds to a drain electrode of the second semiconductor element 32.

As shown in FIG. 10, the second electrode 322 is located on a side opposite to a side the first electrode 321 is located as to the thickness direction z. To the second electrode 322, a voltage corresponding to the power after the conversion by the second semiconductor element 32 is applied. That is, the second electrode 322 corresponds to a source electrode of the second semiconductor element 32. The second electrode 322 includes a plurality of metal plating layers. The second electrode 322 includes a nickel plating layer and a gold plating layer laminated on the nickel plating layer. Otherwise, the second electrode 322 may be configured to include the nickel plating layer, a palladium plating layer laminated on the nickel plating layer and a gold plating layer laminated on the palladium plating layer.

As shown in FIGS. 9 and 10, the gate electrode 323 is arranged on a side the same as a side the second electrode 322 is located as to the thickness direction z, and is separated from the second electrode 322. To the gate electrode 323, a gate voltage for driving the second semiconductor element 32 is applied. As viewed in the thickness direction z, an area of the gate electrode 323 is smaller than an area of the second electrode 322.

As shown in FIG. 9, the second peripheral edge 324 extends along the second direction y as viewed in the thickness direction z. At each of the plurality of second semiconductor elements 32, the second peripheral edge 324 includes a pair of sections separated from each other in the first direction x.

As shown in FIG. 7, a conductive bonding layer 39 bonds the loading surface 211A of the pad portion 211 of the first lead 21 and the plurality of first semiconductor elements 31. Further, conductive bonding layers 39 bond the loading surfaces 221A of the pad portions 221 of the plurality of second leads 22 and the plurality of first semiconductor elements 32, individually. The conductive bonding layer(s) 39 is, for example, a lead-free solder. The material of the conductive bonding layer(s) 39 may be the same as the material of the bonding layer 13. As shown in FIG. 10, the first electrodes 311 of the plurality of first semiconductor elements 31 are bonded to the loading surface 211A of the pad portion 211 with an intervention of the conductive bonding layers 39. Thus, the first electrodes 311 of the plurality of the first semiconductor elements 31 are conducted to the first lead 21. The first electrodes 321 of the plurality of second semiconductor elements 32 are individually bonded to the loading surfaces 221A of the pad portions 221 of the plurality of second leads 22 with an intervention of the conductive bonding layers 39. Thus, the first electrodes 321 of the plurality of second semiconductor elements 32 are individually conducted to the plurality of second leads 22.

As shown in FIG. 3, the plurality of first wires 41 are bonded to the second electrodes 312 of the plurality of first semiconductor elements 31 and the terminal portions 222 of the plurality of second leads 22 individually. Thus, the second electrodes 312 of the plurality of first semiconductor elements 31 are conducted to the plurality of second leads 22 individually. The plurality of first wires 41 contain aluminum (Al). Otherwise, the plurality of first wires 41 may be configured to contain copper.

As shown in FIG. 3, the plurality of second wires 42 are bonded to the second electrodes 322 of the plurality of second semiconductor elements 32 and the plurality of third leads 23 individually. Thus, the second electrodes 322 of the plurality of second semiconductor elements 32 are conducted to the plurality of third leads 23 individually. The plurality of second wires 42 contain aluminum (Al). Otherwise, the plurality of second wires 42 may be configured to contain copper.

On the semiconductor device A10, a plurality of upper arm circuits are formed by the first lead 21, the plurality of first semiconductor elements 31, and the plurality of first wires 41. Further, the plurality of lower arm circuits are formed by the plurality of second leads 22, the plurality of second semiconductor elements 32, the plurality of second wires 42, and the plurality of third leads 23. Thus, the voltage applied to a gate electrode 313 of each of the plurality of first semiconductor elements 31 is relatively higher than the voltage applied to a gate electrode 323 of each of the plurality of second semiconductor elements 32. Further, on the semiconductor device A10, the grounds of the plurality of lower arm circuits are different from one another.

As shown in FIGS. 7 and 9, the pad portion 211 of the first lead 21 includes first regions 213 and a second region 214. The first regions 213 are parts that overlap with the plurality of first semiconductor elements 31 as viewed in the thickness direction z. The second region 214 is separated from the plurality of first semiconductor elements 31 as viewed in the thickness direction z.

As shown in FIG. 9, at least a part of the second region 214 extends along the second direction y. A dimension b of the second region 214 in the first direction x is smaller than a dimension B of each of the plurality of first semiconductor elements 31 in the first direction x. On the semiconductor device A10, one end of the second region 214 with respect to the second direction y reaches the peripheral edge 211C of the pad portion 211. Further, on the semiconductor device A10, as viewed in the thickness direction z, one of the first peripheral edges 314 of the plurality of first semiconductor elements 31 is adjacent to the second region 214 in the first direction x.

Figure 11:
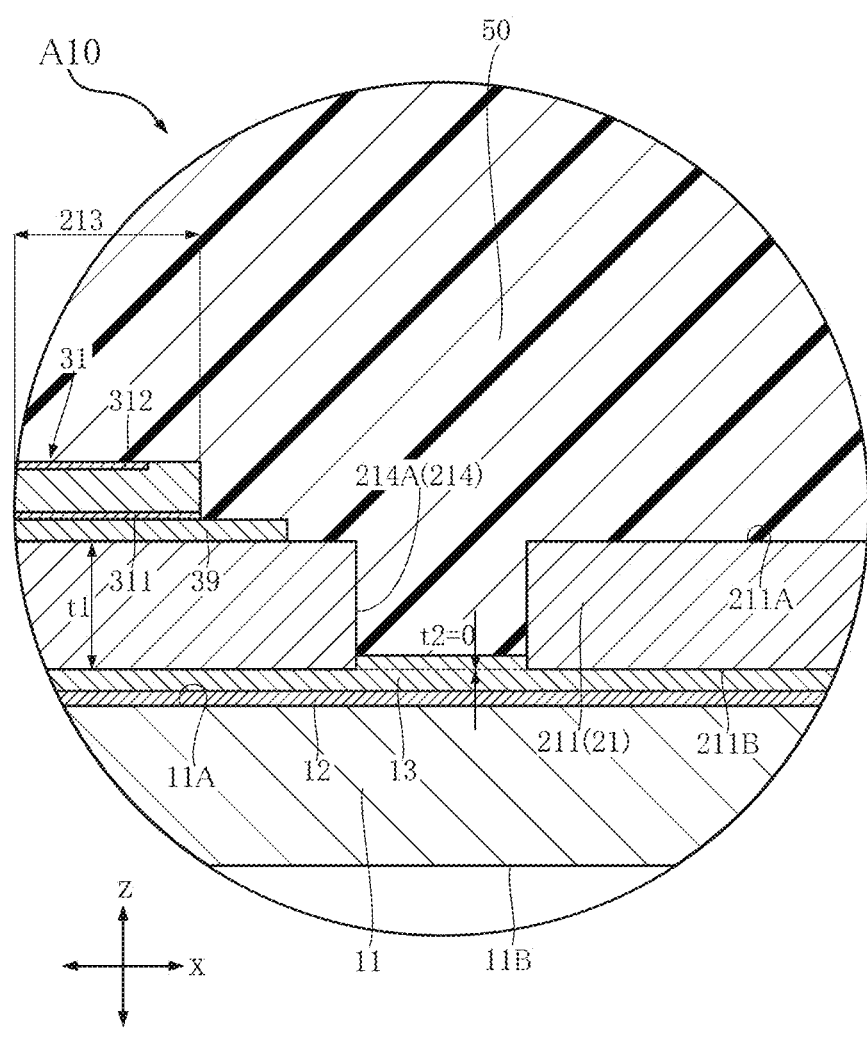
FIG. 11 shows a cross section taken along XI-XI line of FIG. 9.
Figure 12:
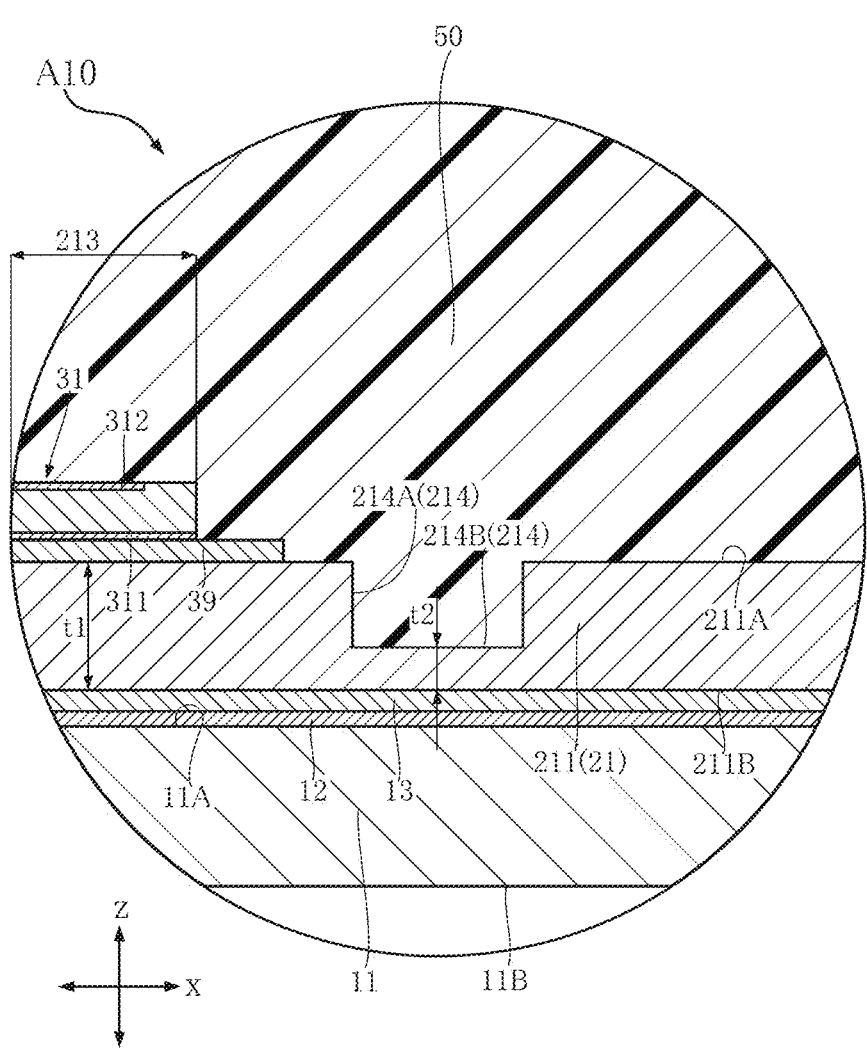
FIG. 12 shows a cross section taken along XI-XI line of FIG. 9.
Figure 13:
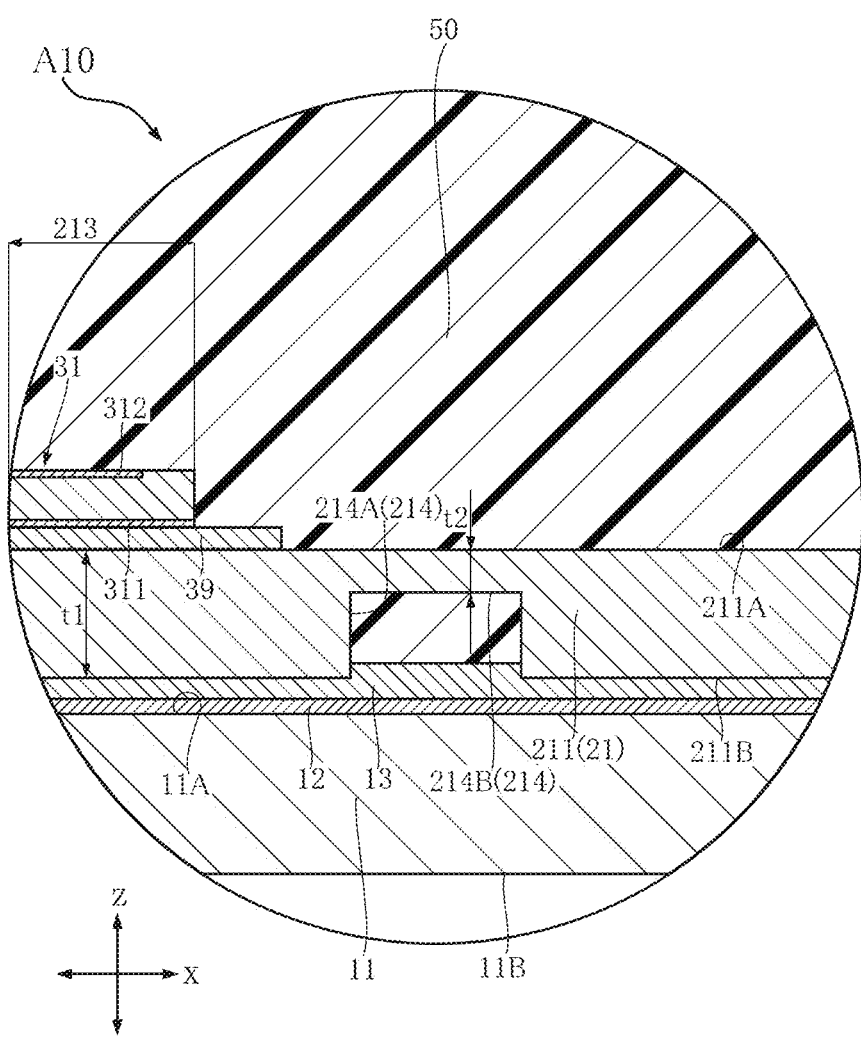
FIG. 13 shows a cross section taken along XI-XI line of FIG. 9.

Next, as shown in FIGS. 11-13, specific examples of the second region 214 are explained. The common feature of these specific examples is that a thickness t2 of the second region 214 is smaller than a thickness t1 of a first region 213.

In the example shown in FIG. 11, the second region 214 is a slit. The slit penetrates the pad portion 211 of the first lead 21 in the thickness direction z. The second region 214 has an inner lateral surface 214A facing in the first direction x. Both the bonding layer 13 and the sealing resin 50 are in contact with the inner lateral surface 214A.

In the example shown in FIG. 12, the second region 214 is a groove recessed from the loading surface 211A of the pad portion 211 of the first lead 21. The second region 214 has the inner lateral surface 214A and a bottom surface 214B. The bottom surface 214B is continuous to the inner lateral surface 214A, and faces a side the same as a side the loading surface 211A faces as to the thickness direction z. The sealing resin 50 is in contact with the inner lateral surface 214A and the bottom surface 214B.

In the example shown in FIG. 13, the second region 214 is a groove recessed from the opposing surface 211B of the pad portion 211 of the first lead 21. The second region 214 has the inner lateral surface 214A and the bottom surface 214B. The bottom surface 214B of this example faces a side the same as a side the opposing surface 211B faces as to the thickness direction z. The bonding layer 13 is in contact with the inner lateral surface 214A. The sealing resin 50 is in contact with the inner lateral surface 214A and the bottom surface 214B.

As shown in FIG. 3, the plurality of driver leads 24 are located on a side opposite to a side the terminal portion 212 of the first lead 21, the terminal portions 222 of the plurality of second leads 22, and the plurality of third leads 23 are located with respect to the substrate 11 as to the second direction y. The plurality of driver leads 24 are supported by the sealing resin 50, not by the substrate 11, as the plurality of third leads 23. As shown in FIGS. 2 and 4, a part of each of the plurality of driver leads 24 is exposed out of the sealing resin 50.

As shown in FIG. 3, the plurality of driver leads 24 include a pad portion 241, a plurality of power supply portions 242, a plurality of first control portions 243, a plurality of second control portions 244, and a dummy portion 245. The pad portion 241 carries the first driver 33 and the second driver 34. Further, the pad portion 241 is set as a ground of the first driver 33 and the second driver 34. A power as the base of the gate voltage to drive the plurality of first semiconductor elements 31 is input to the plurality of power supply portions 242. An electric signal related to the control of the first driver 33 is input to or output from the plurality of first control portions 243. An electric signal related to the control of the second driver 34 is input to or output from the plurality of second control portions 244. The dummy portion 245 is not conducted to either the first driver 33 or the second driver 34.

As shown in FIG. 8, the first driver 33 is bonded to the pad portion 241 with an intervention of a conductive bonding layer 39. The first driver 33 is an LSI. As shown in FIG. 3, the first driver 33 is closer to the pad portion 211 of the first lead 21 than the second driver 34 is. The first driver 33 applies a gate voltage to the gate electrodes 313 of the plurality of first semiconductor elements 31.

As the first driver 33, the second driver 34 is bonded to the pad portion 241 with an intervention of a conductive bonding layer 39. The second driver 34 is an LSI. As shown in FIG. 3, the second driver 34 is closer to the pad portions 221 of the plurality of second leads 22 than the first driver 33 is. The second driver 34 applies a gate voltage to the gate electrodes 323 of the plurality of second semiconductor elements 32.

As shown in FIG. 8, the plurality of diodes 35 are bonded to the plurality of power supply portions 242 with an intervention of conductive bonding layers 39 individually. The plurality of diodes 35 prevent an application of reverse bias to the plurality of power supply portions 242 along with the driving of the plurality of first semiconductor elements 31.

As shown in FIG. 3, the plurality of third wires 43 are connected to the first driver 33, and the second electrodes 312 and the gate electrodes 313 of the plurality of first semiconductor elements 31. Thus, a gate voltage is applied to the gate electrodes 313 of the plurality of first semiconductor elements 31 from the first driver 33. Also, a ground of the gate voltage is set at the first driver 33. The plurality of third wires 43 contain gold, for example.

As shown in FIG. 3, the plurality of fourth wires 44 are connected to the second driver 34, and the gate electrodes 323 of the plurality of second semiconductor elements 32. Thus, a gate voltage is applied to the gate electrodes 323 of the plurality of second semiconductor elements 32 from the second driver 34. The plurality of fourth wires 44 contain gold, for example.

As shown in FIG. 3, the plurality of fifth wires 45 are connected to the first driver 33, the pad portion 241, the plurality of power supply portions 242, the plurality of diodes 35, and the plurality of first control portions 243. Thus, the pad portion 241, the plurality of power supply portions 242, the plurality of diodes 35, and the plurality of first control portions 243 are conducted to the first driver 33. The plurality of fifth wires 45 contain gold, for example.

As shown in FIG. 3, the plurality of sixth wires 46 are connected to the second driver 34, the pad portion 241, and the plurality of second control portions 244. Thus, the pad portion 241 and the plurality of second control portions 244 are conducted to the second driver 34. The plurality of sixth wires 46 contain gold, for example.

Figure 6:
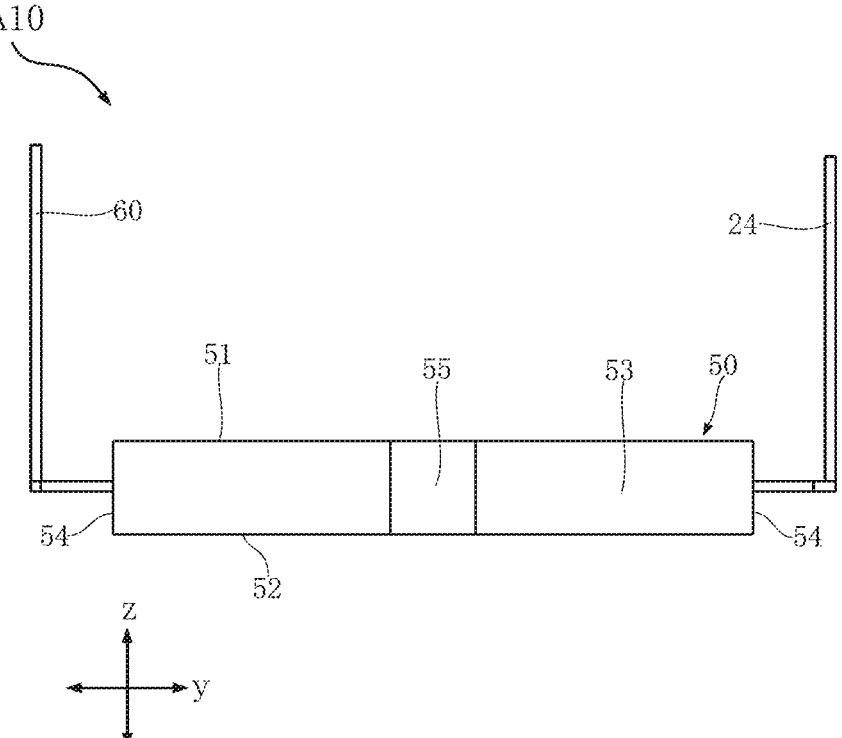
FIG. 6 is a right-side view of the semiconductor device of FIG. 1.

As shown in FIG. 3, the dummy lead 60 is separated from the substrate 11 as viewed in the thickness direction z. The dummy lead 60 is located on a side opposite to a side the terminal portions 222 of the plurality of second leads 22 are located with respect to the terminal portion 212 of the first lead 21 as to the first direction x. As shown in FIGS. 2, 4, and 6, a part of the dummy lead 60 is exposed out of the sealing resin 50.

As shown in FIGS. 7 and 8, the sealing resin 50 covers the plurality of first semiconductor elements 31, the plurality of second semiconductor elements 32, and a part of each of the first lead 21 and the plurality of second leads 22. The sealing resin 50 has an electric insulation property. The sealing resin 50 is made of a material including black epoxy resin, for example. The sealing resin 50 has a top surface 51, a bottom surface 52, a pair of first lateral surfaces 53, a pair of second lateral surfaces 54, and a pair of recessions 55.

As shown in FIGS. 7 and 8, the top surface 51 faces a side the same as a side the obverse surface 11A of the substrate 11 faces as to the thickness direction z. As shown in FIGS. 7 and 8, the bottom surface 52 faces a side opposite to a side the top surface 51 faces as to the thickness direction z. As shown in FIG. 4, the reverse surface 11B of the substrate 11 is exposed out of the bottom surface 52.

As shown in FIGS. 2, 4, and 5, the pair of first lateral surfaces 53 are separated from each other in the first direction x. Each of the pair of first lateral surfaces 53 is continuous to the top surface 51 and the bottom surface 52.

As shown in FIGS. 2, 4, and 6, the pair of second lateral surfaces 54 are separated from each other in the second direction y. Each of the pair of second lateral surfaces 54 is continuous to the top surface 51 and the bottom surface 52. Out of one second lateral surface 54 of the pair of second lateral surfaces 54, a part of each of the terminal portion 212 of the first lead 21, the terminal portions 222 of the plurality of second leads 22, the plurality of third leads 23, and the dummy lead 60 is exposed. Out of the other second lateral surface 54 of the pair of second lateral surfaces 54, a part of each of the plurality of driver leads 24 is exposed.

As shown in FIGS. 2, 4, and 6, the pair of recessions 55 are recessed in the first direction x from the pair of the first lateral surfaces 53. Along the thickness direction z, the pair of recessions 55 extend from the top surface 51 to reach the bottom surface 52. The pair of recessions 55 secures a longer creepage distance of the sealing resin 50 of the pair of recessions 55 from any of the terminal portion 212 of the first lead 21 and the plurality of third leads 23 to any of the plurality of driver leads 24. This is profitable in improving the dielectric strength of the semiconductor device A10.

Next, based on FIGS. 14-18, semiconductor devices A11-A15 are explained which are variations of the semiconductor device A10. Those variations are different from the semiconductor device A10 regarding the configuration of the second region 214 of the pad portion 211 of the first lead 21.

Figure 14:
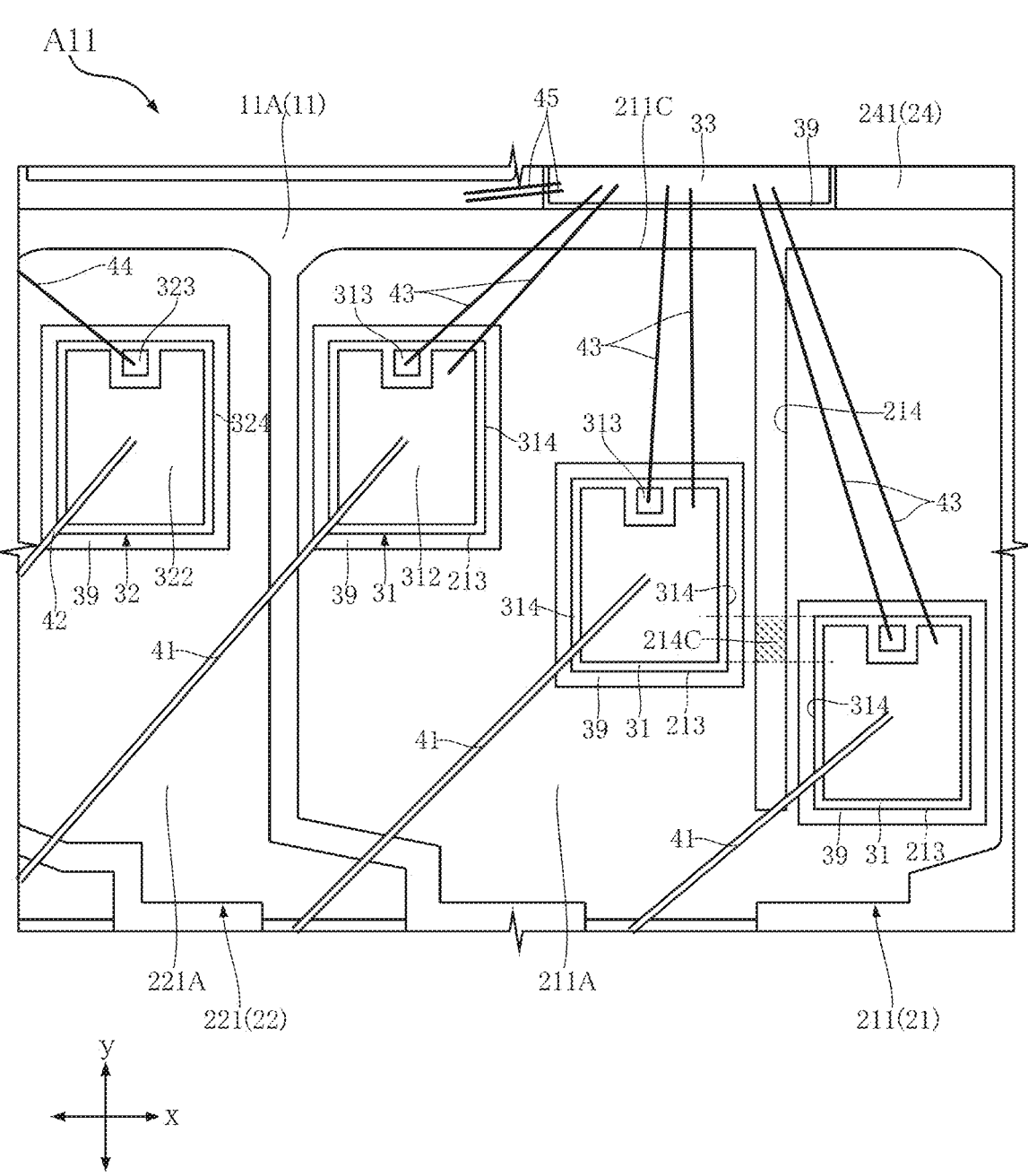
FIG. 14 is a partial enlarged view of the semiconductor device according to the first variation of the first embodiment of the present disclosure, and corresponds to FIG. 9.

Based on FIG. 14, the semiconductor device A11 is explained which is a first variation example of the semiconductor device A10.

As shown in FIG. 14, on the semiconductor device A11, the second region 214 has a gap portion 214C. With respect to the two first semiconductor elements 31 that are separated from each other in the second direction y from among the plurality of first semiconductor elements 31, the gap portion 214C is located between the first peripheral edge 314 of one first semiconductor 31 and the first peripheral edge 314 of the other first semiconductor 31 as viewed in the thickness direction z.

Figure 15:
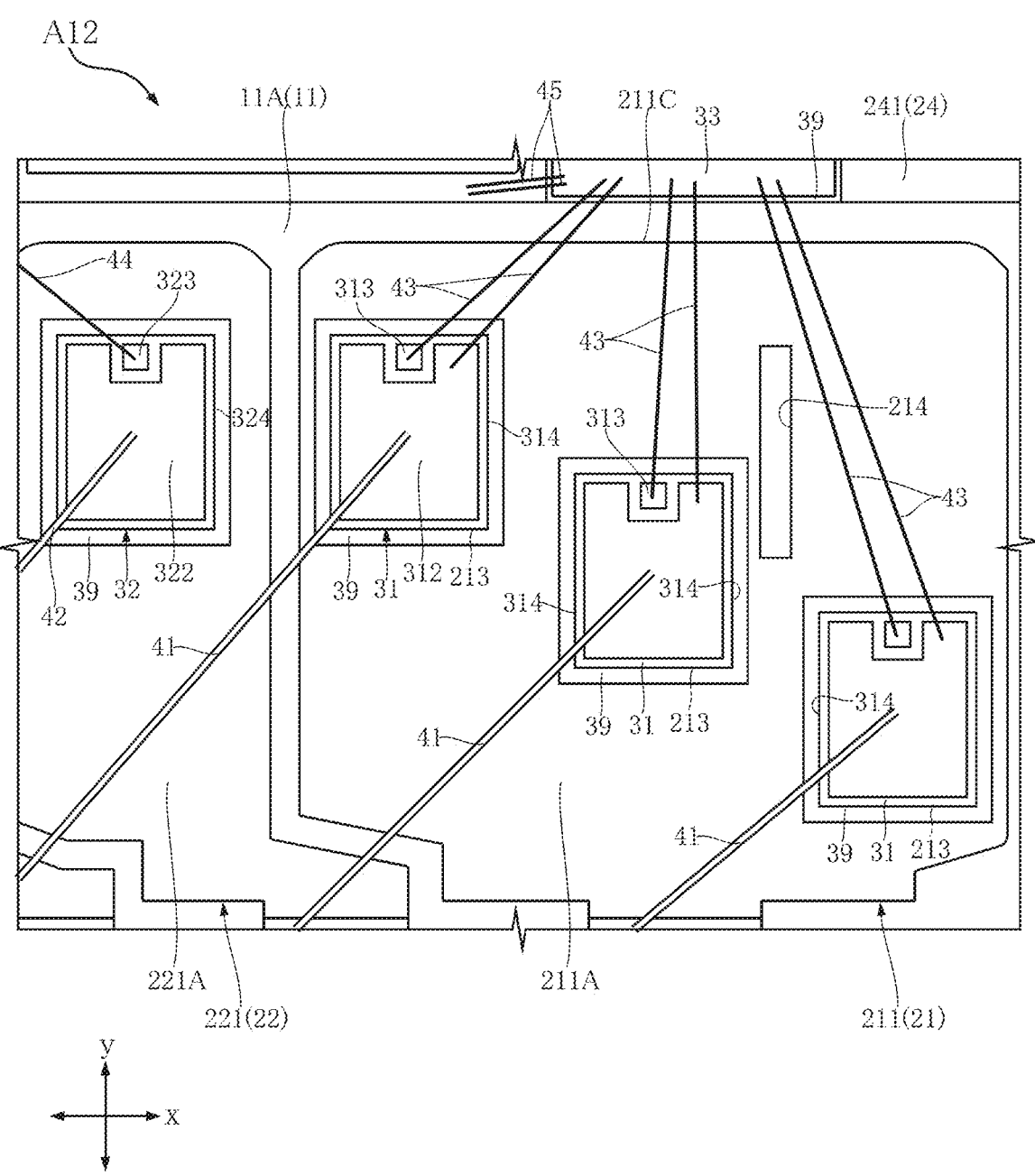
FIG. 15 is a partial enlarged view of the semiconductor device according to the second variation of the first embodiment of the present disclosure, and corresponds to FIG. 9.

Based on FIG. 15, the semiconductor device A12 is explained which is a second variation example of the semiconductor device A10.

As shown in FIG. 15, on the semiconductor device A12, the second region 214 is encompassed within the circumference of the peripheral edge 211C of the pad portion 211. Therefore, the both ends of the second region 214 as to the second direction y are enclosed by the other regions of the pad portion 211.

Figure 16:
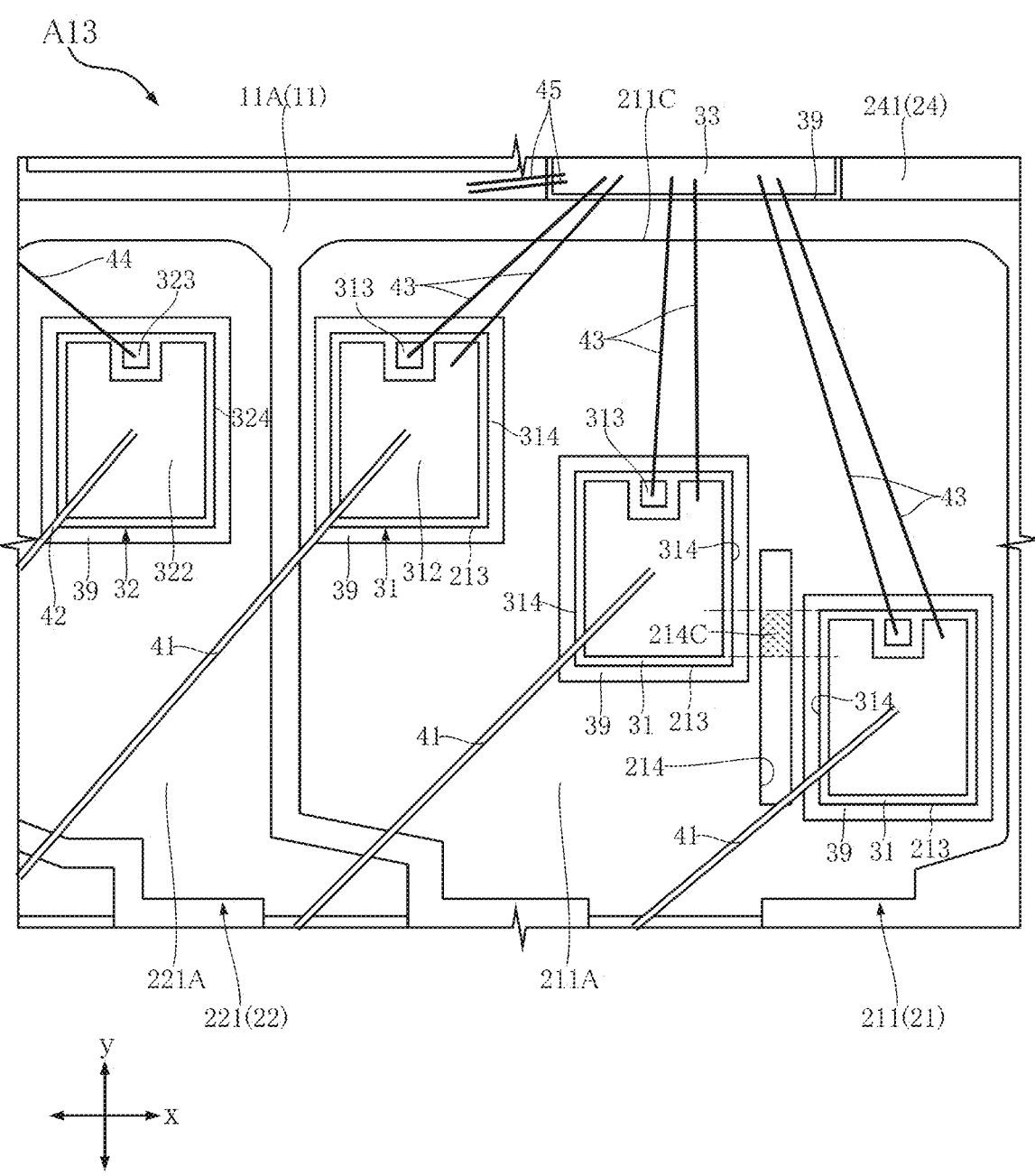
FIG. 16 is a partial enlarged view of the semiconductor device according to the third variation of the first embodiment of the present disclosure, and corresponds to FIG. 9.

Based on FIG. 16, the semiconductor device A13 is explained which is a third variation example of the semiconductor device A10.

As shown in FIG. 16, on the semiconductor device A13, the second region 214 is encompassed within the circumference of the peripheral edge 211C of the pad portion 211. Further, the second region 214 has the gap portion 214C.

Figure 17:
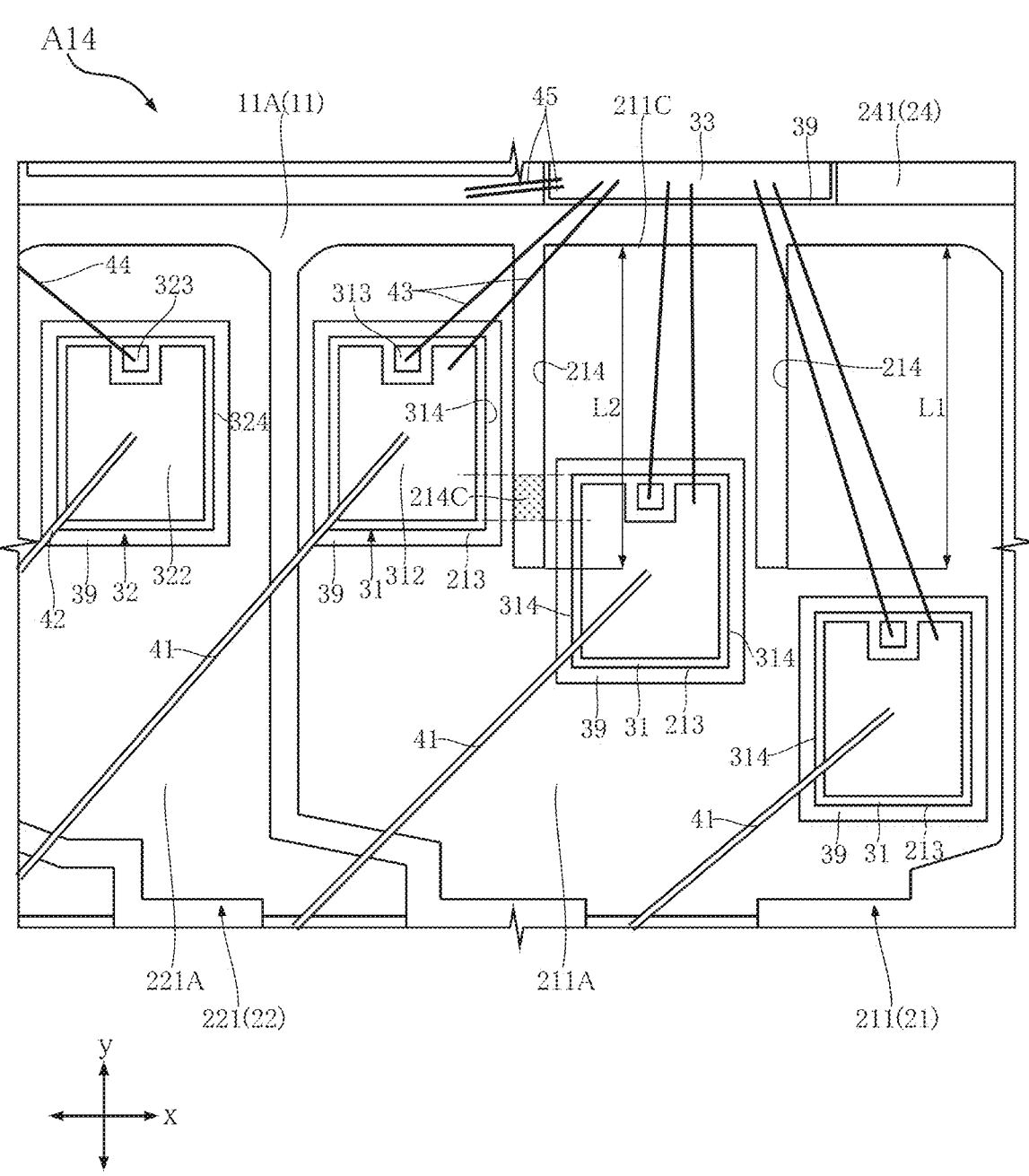
FIG. 17 is a partial enlarged view of the semiconductor device according to the fourth variation of the first embodiment of the present disclosure, and corresponds to FIG. 9.

Based on FIG. 17, the semiconductor device A14 is explained which is a fourth variation example of the semiconductor device A10.

As shown in FIG. 17, on the semiconductor device A14, the second region 214 includes two sections. One section from among the two sections has a gap portion 214C. Lengths L1 and L2 of the two sections are equal to each other. However, if it is configured that one section from among the two sections has the gap portion 214C, the lengths L1 and L2 of the two sections can be different from each other.

Figure 18:
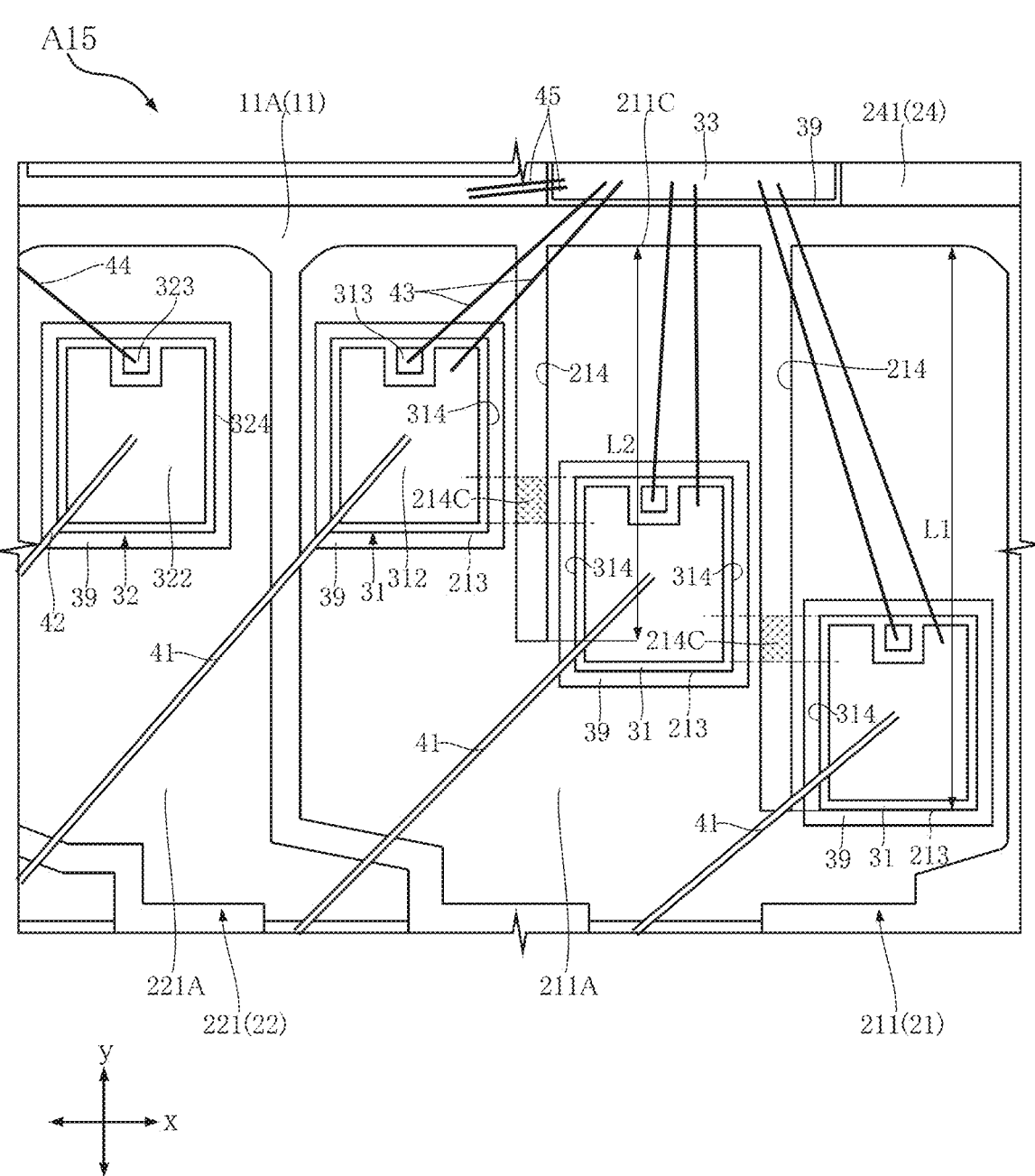
FIG. 18 is a partial enlarged view of the semiconductor device according to the fifth variation of the first embodiment of the present disclosure, and corresponds to FIG. 9.

Based on FIG. 18, the semiconductor device A15 is explained which is a fifth variation example of the semiconductor device A10.

As shown in FIG. 18, on the semiconductor device A15, the second region 214 includes two sections. Each of the two section has a gap portion 214C. The lengths L1 and L2 of the two sections are different from each other. However, as long as it is configured that each of the two sections has the gap portion 214C, the lengths L1 and L2 of the two sections can be equal to each other.

Next, the action effects of the semiconductor device A10 are explained.

The semiconductor device A10 is provided with the substrate 11 and the first lead 21 fixed on the obverse surface 11A. The dimension of the substrate 11 in the first direction x (the first dimension D1 shown in FIG. 3) is larger than the dimension of the substrate 11 in the second direction y (the second dimension D2 shown in FIG. 3). The first lead 21 includes the first regions 213 overlapped with the first semiconductor elements 31 as viewed in the thickness direction z and the second region 214 separated from the first semiconductor elements 31 as viewed in the thickness direction z. At least a part of the second region 214 extends along the second direction y. The thickness t2 of the second region 214 is smaller than the thickness t1 of a first region 213. When heat is given to the substrate 11 and the first lead 21, according to the configuration of the semiconductor device A10, both the amount of expansion and the amount of contraction of the substrate 11 and the first lead 21 with respect to the first direction x are larger than those with respect to the second direction y. Therefore, as for the thermal strain that occurs due to the difference of the linear expansion coefficients on the interface between the substrate 11 and the first lead 21, the component of the first direction x is larger than the component of the second direction y. Then, according to the configuration of the semiconductor device A10, the component of the thermal strain with respect to the first direction x is dissipated by the second region 214. Thus, the concentration of the thermal strain on the interface between the substrate 11 and the first lead 21 is alleviated, and the maximum thermal stress that originates from the thermal strain and acts on the substrate 11 decreases. Therefore, according to the semiconductor device A10, the concentration of the thermal stress acting on the substrate 11 to which a lead (the first lead 21) is fixed can be reduced.

A specific example of the second region 214 can be any of the slit shown in FIG. 11, the groove recessed from the loading surface 211A of the pad portion 211 of the first lead 21 shown in FIG. 12, and the groove recessed from the opposing surface 211B of the pad portion 211 shown in FIG. 13. In the case where the second region 214 takes the form of a specific example of either the slit shown in FIG. 11 or the groove recessed from the opposing surface 211B shown in FIG. 13 from among those specific examples, the bonding layer 13 is in contact with the inner lateral surface 214A of the second region 214. Thus, the anchoring effect occurs on the bonding layer 13 with respect to the first lead 21, and the bonding strength of the first lead 21 with respect to the substrate 11 can be improved. Further, in the assumption that the second region 214 takes the form of a specific example of either the slit shown in FIG. 11 or the groove recessed from the loading surface 211A shown in FIG. 12 from among those specific examples, when the first semiconductor elements 31 are bonded to the pad portion 211 in the manufacturing process of the semiconductor device A10, a molten conductive bonding layer 39 wet-spreading on the loading surface 211A flows into the second region 214. Thus, an extreme wet-spreading of the conductive bonding layer 39 can be prevented, and dislocation of the first semiconductor elements 31 originating from the wet-spreading can be restrained.

The first semiconductor element 31 has the first peripheral edge 314 extending along the second direction y as viewed in the thickness direction z. As viewed in the thickness direction z, the first peripheral edge 314 is located adjacent to the second region 214 in the first direction x. Thus, the first regions 213 of the first lead 21 adjacent to the second region 214 in the first direction x is configured to be held between the substrate 11 and the first semiconductor element 31 in the thickness direction z. Further, the linear expansion coefficient of the semiconductor substrates included in the first semiconductor elements 31 is smaller than the linear expansion coefficient of the first lead 21. Accordingly, the thermal expansion and the thermal contraction of the first regions 213 with respect to the direction orthogonal to the thickness direction z are constrained by the substrate 11 and the first semiconductor element 31. Therefore, the component of the first direction x of the thermal strain that occurs due to the difference of the linear expansion coefficients on the interface between the substrate 11 and the first lead 21 is dissipated and reduced, and the concentration of the thermal stress acting on the substrate 11 can be more effectively reduced.

The semiconductor device A10 is provided with two first semiconductor elements 31 separated from each other in the second direction y. As viewed in the thickness direction z, the second region 214 has the gap portion 214C between the first peripheral edge 314 of one first semiconductor element 31 and the first peripheral edge 314 of the other first semiconductor element 31. Thus, the first regions 213 of the first leads 21 located on both sides of the second region 214 as to the first direction x are held between the substrate 11 and the two first semiconductor elements 31 in the thickness direction z. Therefore, the thermal strain on the interface between the substrate 11 and the first lead 21 originated from the difference of the linear expansion coefficients on the both sides of the second region 214 as to the first direction x is reduced. Accordingly, the component of the first direction x of the thermal strain dissipated by the second region 214 can hardly concentrate in the vicinity of the second region 214.

The semiconductor device A10 is further provided with the base layer 12 laminated on the obverse surface 11A of the substrate 11. The bonding layer 13 bonds the base layer 12 and the first lead 21. The base layer 12 and the bonding layer 13 contain a metallic element. Thus, the affinity of the bonding layer 13 with respect to the base layer 12 increases, and the bonding strength of the first lead 21 with respect to the substrate 11 can be improved. In this case, it is preferable in increasing the affinity of the bonding layer 13 with respect to the base layer 12 that the base layer 12 contains silver and the bonding layer 13 contains tin.

The semiconductor device A10 is further provided with the sealing resin 50 that covers a part of each of the substrate 11 and the first lead 21, and the first semiconductor elements 31. The sealing resin 50 is in contact with the second region 214. According to this configuration, the anchoring effect occurs on the sealing resin 50. Thus, the bonding strength of the sealing resin 50 with respect to the first lead 21 can be improved.

The substrate 11 has the reverse surface 11B facing a side opposite to a side the obverse surface 11A faces as to the thickness direction z. The reverse surface 11B is exposed out of the sealing resin 50. Therefore, the heat dissipation of the semiconductor device A10 can be improved.

Figure 19:
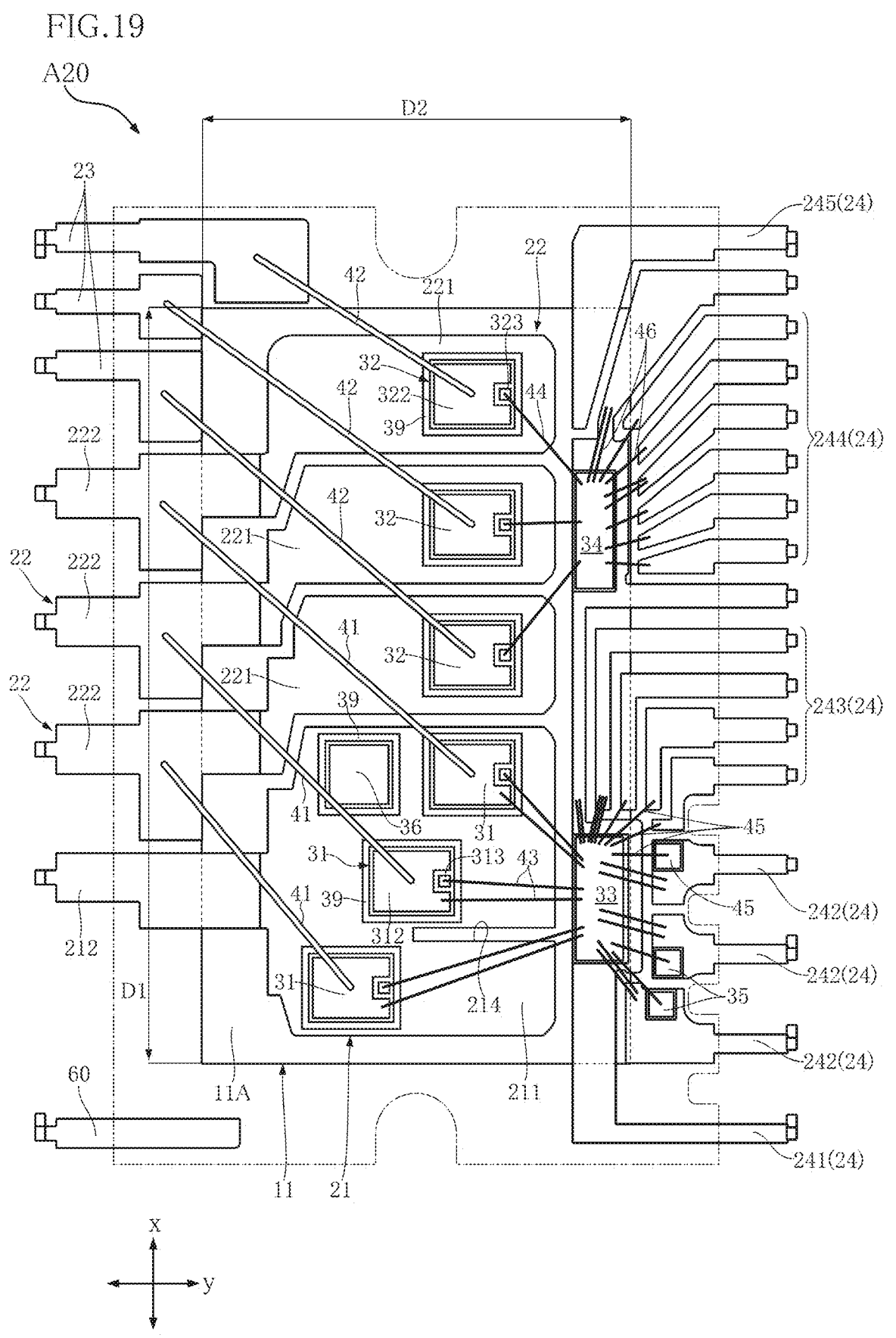
Figure 20:
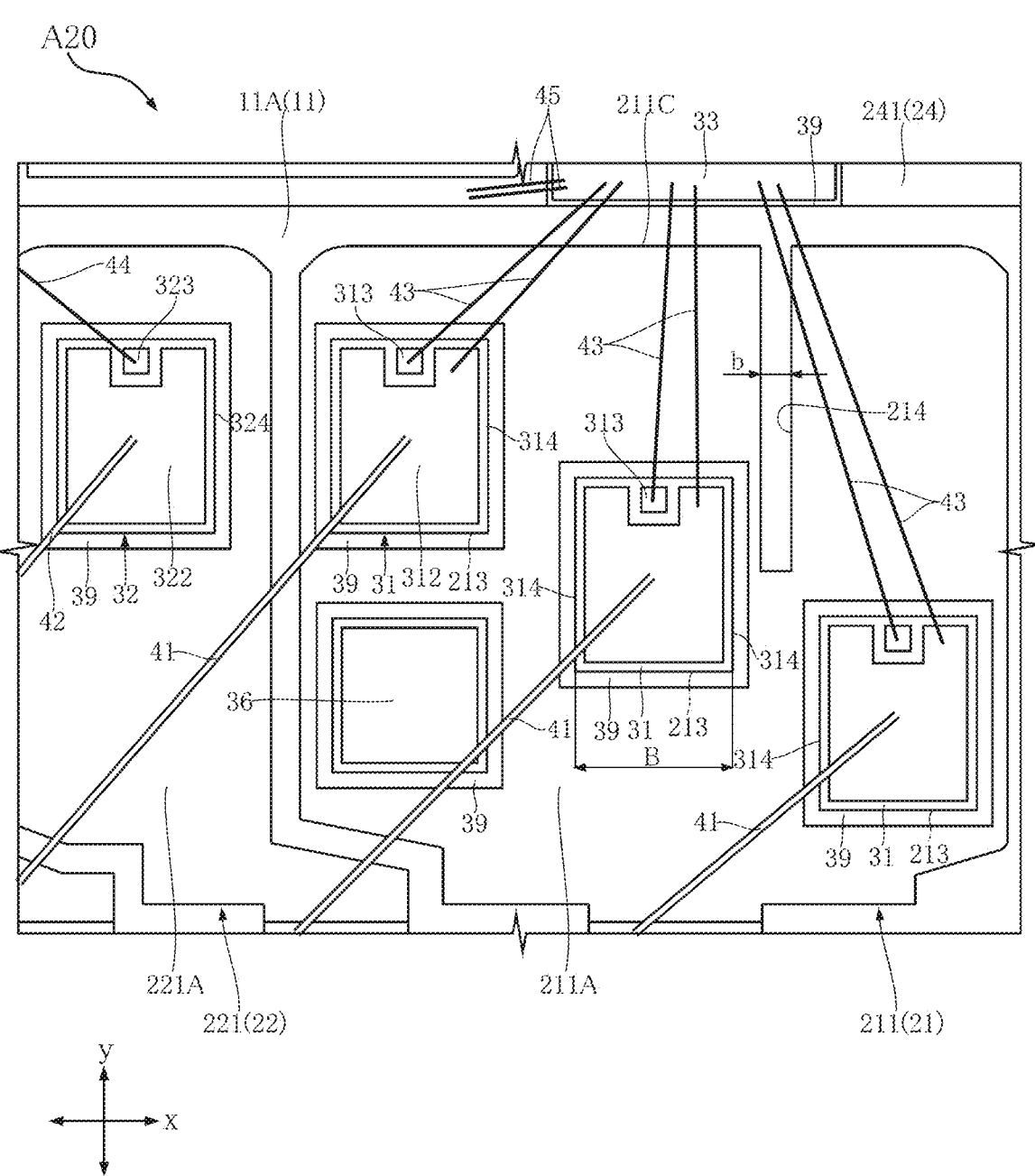
FIG. 20 is a partial enlarged view of FIG. 19.

Based on FIGS. 19 and 20, the semiconductor device A20 according to the second embodiment of the present disclosure is explained. In those figures, the same reference symbols are used for the components that are the same as or similar to those of the semiconductor device A10 explained above, and redundant explanations are skipped. Here, in FIG. 19, the sealing resin 50 is depicted as being transparent for ease of understanding. In FIG. 19, the transparent sealing resin 50 is drawn by an imaginary line.

The semiconductor device A20 is different from the semiconductor device A10 explained above in that it is provided with the dummy element 36.

As shown in FIGS. 19 and 20, the dummy element 36 is arranged on the loading surface 211A of the pad portion 211 of the first lead 21. The dummy element 36 is separated from the second region 214. Further, the dummy element 36 is located on a side where some of the plurality of first semiconductor elements 31 is arranged with respect to the second region 214 as to the first direction x.

The dummy element 36 is bonded to the loading surface 211A of the pad portion 211 with an intervention of a conductive bonding layer 39. The dummy element 36 is, for example, a diode. It does not matter whether or not the dummy element 36 is conducted to the first lead 21. The linear expansion coefficient of the semiconductor substrate included in the dummy element 36 is smaller than the linear expansion coefficient of the first lead 21. It is preferable that the linear expansion coefficient of the semiconductor substrate in question has a value comparatively close to the linear expansion coefficient of the semiconductor substrate of each of the plurality of the first semiconductor elements 31. Further, it is more preferable that as viewed in the thickness direction z, the area of the dummy element 36 is comparatively close to the area of each of the plurality of the first semiconductor elements 31.

On the semiconductor device A20, the dummy element 36 is located adjacent to one of the plurality of first semiconductor elements 31 in the second direction y.

Next, the action effects of the semiconductor device A20 are explained.

The semiconductor device A20 is provided with the substrate 11 and the first lead 21 fixed on the obverse surface 11A. The dimension of the substrate 11 in the first direction x (the first dimension D1 shown in FIG. 3) is larger than the dimension of the substrate 11 in the second direction y (the second dimension D2 shown in FIG. 3). The first lead 21 includes the first regions 213 overlapped with the first semiconductor elements 31 as viewed in the thickness direction z and the second region 214 separated from the first semiconductor elements 31 as viewed in the thickness direction z. At least a part of the second region 214 extends along the second direction y. The thickness t2 of the second region 214 is smaller than the thickness t1 of a first region 213. Therefore, according to the semiconductor device A20 as well, the concentration of the thermal stress acting on the substrate 11 to which a lead (the first lead 21) is fixed can be reduced.

The semiconductor device A20 is further provided with the dummy element 36 arranged on the loading surface 211A of the first lead 21 and separated from the second region 214. The dummy element 36 is located on a side where the first semiconductor element 31 is arranged with respect to the second region 214 as to the first direction x. Thus, the first lead 21 is configured to be held between the substrate 11, and the first semiconductor elements 31 and the dummy element 36 in the thickness direction z. Further, the linear expansion coefficient of each of the semiconductor substrates included in the first semiconductor elements 31 and the semiconductor substrate included in the dummy element 36 is smaller than the linear expansion coefficient of the first lead 21. Accordingly, the thermal expansion and the thermal contraction of the first lead 21 in the direction orthogonal to the thickness direction z are constrained by the substrate 11, the first semiconductor elements 31 and the dummy element 36. Therefore, the thermal strain that occurs due to the difference of the linear expansion coefficients on the interface between the substrate 11 and the first lead 21 is reduced, and the concentration of the thermal stress acting on the substrate 11 can be more effectively reduced.

The dummy element 36 is located adjacent to the first semiconductor element 31 in the second direction y. Thus, the constraint of the thermal expansion and the thermal contraction of the first lead 21 by the substrate 11, the first semiconductor elements 31 and the dummy element 36 is stronger as for the first direction x than that as for the second direction y. Accordingly, as for the thermal strains on the interface between the substrate 11 and the first lead 21, the component of the thermal strains with respect to the first direction x is reduced more than the other components are. Therefore, the maximum thermal stress acting on the substrate 11 can be effectively reduced.

Figure 21:
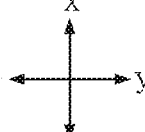
FIG. 21 is a plan view of the semiconductor device according to the third embodiment of the present disclosure, in which the sealing resin is depicted as being transparent.

Based on FIG. 21, the semiconductor device A30 according to the third embodiment of the present disclosure is explained. In this figure, the same reference symbols are used for the components that are the same as or similar to those of the semiconductor device A10 explained above, and redundant explanations are skipped. Here, in FIG. 21, the sealing resin 50 is depicted as being transparent for ease of understanding. In FIG. 21, the transparent sealing resin 50 is drawn by an imaginary line.

The semiconductor device A30 is different from the semiconductor device A10 explained above regarding the configurations of the first lead 21, the plurality of second leads 22 and the third lead 23. Further, the semiconductor device A30 is not provided with the dummy lead 60.

As shown in FIG. 21, the pad portion 221 of each of the plurality of second leads 22 has a base portion 221C and an oblique portion 221D. On the base portion 221C, one of the plurality of second semiconductor elements 32 is loaded. The oblique portion 221D is coupled to the base portion 221C and a terminal portion 222 of a second lead 22. As viewed in the thickness direction z, the oblique portion 221D is inclined with respect to the second direction y. According to this configuration, on the pad portion 211 of the first lead 21 adjacent to the second lead 22, the peripheral edge 211C adjacent to the oblique portion 221D of the second lead 22 is inclined in the same direction as the oblique portion 221D is with respect to the second direction y.

As shown in FIG. 21, the third lead 23 is a single member. The plurality of second wires 42 are connected to the third lead 23. As such, on the semiconductor device A30, the plurality of lower arm circuits have a common ground.

Next, the action effects of the semiconductor device A30 are explained.

The semiconductor device A30 is provided with the substrate 11 and the first lead 21 fixed on the obverse surface 11A. The dimension of the substrate 11 in the first direction x (the first dimension D1 shown in FIG. 3) is larger than the dimension of the substrate 11 in the second direction y (the second dimension D2 shown in FIG. 3). The first lead 21 includes the first regions 213 overlapped with the first semiconductor elements 31 as viewed in the thickness direction z and the second region 214 separated from the first semiconductor elements 31 as viewed in the thickness direction z. At least a part of the second region 214 extends along the second direction y. The thickness t2 of the second region 214 is smaller than the thickness t1 of a first region 213. Therefore, according to the semiconductor device A30 as well, the concentration of the thermal stress acting on the substrate 11 to which a lead (the first lead 21) is fixed can be reduced.

Figure 22:
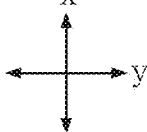
FIG. 22 is a plan view of the semiconductor device according to the fourth embodiment of the present disclosure, in which the sealing resin is depicted as being transparent.

Based on FIG. 22, the semiconductor device A40 according to the fourth embodiment of the present disclosure is explained. In this figure, the same reference symbols are used for the components that are the same as or similar to those of the semiconductor device A10 explained above, and redundant explanations are skipped. Here, in FIG. 22, the sealing resin 50 is depicted as being transparent for ease of understanding. In FIG. 22, the transparent sealing resin 50 is drawn by an imaginary line.

The semiconductor device A40 is provided with, in lieu of the plurality of driver leads 24, a plurality of first gate terminals 25, a plurality of second gate terminals 26, a plurality of first detection terminals 27, a plurality of second detection terminals 28 and a pair of temperature detection terminals 29. As shown in FIG. 22, those terminals are located on a side opposite to a side the terminal portion 212 of the first lead 21, the terminal portions 222 of the plurality of second leads 22, and the third lead 23 are located with respect to the substrate 11 at to the second direction y, and are arranged along the first direction x. A part of each of those terminals is exposed out of one second lateral surface 54 of the sealing resin 50. Those terminals are composed of the same lead frame together with the first lead 21, the plurality of second leads 22 and the third lead 23. Further, the semiconductor device A40 is provided with a thermistor 37, in lieu of the first driver 33, the second driver 34, and the plurality of diodes 35. As for those configurations, it is different from the semiconductor device A30 explained above. Therefore, the semiconductor device A40 is not an IPM, but is a general power module. However, note that the semiconductor device 40 is configured that a three-phase AC power is output from the terminal portions 222 of the plurality of second leads 22.

As shown in FIG. 22, the plurality of first gate terminals 25 are closer to the pad portion 211 of the first lead 21 than the plurality of second gate terminals 26 are. The plurality of first gate terminals 25 are fixed to the obverse surface 11A of the substrate 11 with an intervention of the base layer 12 and the bonding layer 13. A plurality of third wires 43 are connected to the plurality of first gate terminals 25 and the gate electrodes 313 of the plurality of first semiconductor elements 31 individually. According to this configuration, each of the plurality of first gate terminals 25 is conducted to one of the gate electrodes 313 of the plurality of first semiconductor elements 31. To the plurality of first gate terminals 25, a gate voltage for driving the plurality of first semiconductor elements 31 is applied.

As shown in FIG. 22, the plurality of second gate terminals 26 are closer to the pad portions 211 of the plurality of second leads 22 than the plurality of first gate terminals 25 are. The plurality of second gate terminals 26 are fixed to the obverse surface 11A of the substrate 11 with an intervention of the base layer 12 and the bonding layer 13. A plurality of fourth wires 44 are connected to the plurality of second gate terminals 26 and the gate electrodes 323 of the plurality of second semiconductor elements 32 individually. According to this configuration, each of the plurality of second gate terminals 26 is conducted to a gate electrode 323 of one of the plurality of second semiconductor elements 32. To the plurality of second gate terminals 26, a gate voltage for driving the plurality of second semiconductor elements 32 is applied.

As shown in FIG. 22, each of the plurality of first detection terminals 27 is adjacent to one the plurality of first gate terminals 25 in the first direction x. The plurality of first detection terminals 27 are fixed to the obverse surface 11A of the substrate 11 with an intervention of the base layer 12 and the bonding layer 13. A plurality of third wires 43 are connected to the plurality of first detection terminals 27 and the second electrodes 312 of the plurality of first semiconductor elements 31 individually. According to this configuration, each of the plurality of first detection terminals 27 is conducted to a second electrodes 312 of one of the plurality of first semiconductor elements 31. To each of the plurality of first detection terminals 27, a voltage the same as the voltage applied for a second electrode 312 of one of the plurality of first semiconductor elements 31 is applied.

As shown in FIG. 22, each of the plurality of second detection terminals 28 is adjacent to one the plurality of second gate terminals 26 in the first direction x. The plurality of second detection terminals 28 are fixed to the obverse surface 11A of the substrate 11 with an intervention of the base layer 12 and the bonding layer 13. A plurality of fourth wires 44 are connected to the plurality of second detection terminals 28 and the second electrodes 322 of the plurality of second semiconductor elements 32 individually. According to this configuration, each of the plurality of second detection terminals 28 is conducted to a second electrode 322 of one of the plurality of second semiconductor elements 32. To each of the plurality of second detection terminals 28, a voltage the same as the voltage applied for a second electrode 322 of one of the plurality of second semiconductor elements 32 is applied.

As shown in FIG. 22, the pair of temperature detection terminals 29 are located on a side opposite to a side the third lead 23 is located with respect to the substrate 11 as to the second direction y. The pair of temperature detection terminals 29 are bonded to the wirings 61 arranged on the obverse surface 11A of the substrate 11.

As shown in FIG. 22, the thermistor 37 is bonded to the wirings 61. Therefore, the pair of temperature detection terminals 29 are conducted to the thermistor 37 via the wirings 61. According to this configuration, by applying a voltage to the pair of temperature detection terminals 29, the temperature of the substrate 11 when the semiconductor device A40 is in use can be detected.

Next, the action effects of the semiconductor device A40 are explained.

The semiconductor device A40 is provided with the substrate 11 and the first lead 21 fixed on the obverse surface 11A. The dimension of the substrate 11 in the first direction x (the first dimension D1 shown in FIG. 3) is larger than the dimension of the substrate 11 in the second direction y (the second dimension D2 shown in FIG. 3). The first lead 21 includes the first regions 213 overlapped with the first semiconductor elements 31 as viewed in the thickness direction z and the second region 214 separated from the first semiconductor elements 31 as viewed in the thickness direction z. At least a part of the second region 214 extends along the second direction y. The thickness t2 of the second region 214 is smaller than the thickness t1 of a first region 213. Therefore, according to the semiconductor device A40 as well, the concentration of the thermal stress acting on the substrate 11 to which a lead (the first lead 21) is fixed can be reduced.

The present disclosure is not limited to the embodiments explained above. The specific configuration of each components of the present disclosure can be freely altered in various manners.

The present disclosure includes the embodiments described by the following clauses.

Clause 1A.

A semiconductor device, comprising:
a substrate having an obverse surface facing in a thickness direction;
a first lead having a loading surface facing a side same as a side the obverse surface faces as to the thickness direction and being fixed on the obverse surface; and
a first semiconductor element arranged on the loading surface, wherein a dimension of the substrate in a first direction orthogonal to the thickness direction is larger than a dimension of the substrate in a second direction orthogonal to the thickness direction and the first direction, the first lead comprises a first region overlapped with the first semiconductor element as viewed in the thickness direction and a second region separated from the first semiconductor element as viewed in the thickness direction, and at least a part of the second region extends along the second direction, and a thickness of the second region is smaller than a thickness of the first region.

Clause 2.

The semiconductor device according to clause 1, wherein one end of the second region as to the second direction reaches a peripheral edge of the first lead.

Clause 3.

The semiconductor device according to clause 1 or 2, wherein the first semiconductor element has a first peripheral edge extending along the second direction as viewed in the thickness direction, and the first peripheral edge is adjacent to the second region in the first direction as viewed in the thickness direction.

Clause 4.

The semiconductor device according to clause 3, further comprising two additional semiconductor elements separated from each other in the second direction, wherein the second region has a gap portion located between the two additional semiconductor elements as viewed in the thickness direction.

Clause 5.

The semiconductor device according to any of clauses 1 to 4, wherein a dimension of the second region in the first direction is smaller than a dimension of the first semiconductor element in the first direction.

Clause 6.

The semiconductor device according to any of clauses 1 to 5, wherein the second region is a slit.

Clause 7.

The semiconductor device according to any of clauses 1 to 5, wherein the second region is a groove recessed from the loading surface.

Clause 8.

The semiconductor device according to any of clauses 1 to 5, wherein the first lead has an opposing surface opposed to the obverse surface, and the second region is a groove recessed from the opposing surface.

Clause 9.

The semiconductor device according to any of clauses 1 to 8, further comprising a dummy element arranged on the loading surface and separated from the second region, wherein the dummy element is located on a side the first semiconductor element is located with respect to the second region as to the first direction.

Clause 10.

The semiconductor device according to clause 9, wherein the dummy element is adjacent to the first semiconductor element in the second direction.

Clause 11.

The semiconductor device according to any of clauses 1 to 10, further comprising:

a base layer laminated on the obverse surface; and a bonding layer for bonding the base layer and the first lead, wherein base layer and the bonding layer contain a metallic element.

Clause 12.

The semiconductor device according to clause 11, wherein the base layer contains silver, and the bonding layer contains tin.

Clause 13.

The semiconductor device according to any of clauses 1 to 12, further comprising a conductive bonding layer for bonding the loading surface and the first semiconductor element, wherein the first semiconductor element is conducted to the first lead.

Clause 14.

The semiconductor device according to clause 13, further comprising:

a second lead fixed on the obverse surface and separated from the first lead;

a second semiconductor element arranged on the second lead and conducted to the second lead, wherein the second lead is conducted to the first semiconductor element.

Clause 15.

The semiconductor device according to clause 14, further comprising:

a third lead separated from the first lead and the second lead, wherein the third lead is conducted to the second semiconductor element.

Clause 16.

The semiconductor device according to any of clauses 1 to 15, further comprising a sealing resin for covering a part of each of the substrate and the first lead and the first semiconductor element, wherein the sealing resin is in contact with the second region.

Clause 17.

The semiconductor device according to clause 16, wherein the substrate has a reverse surface facing a side opposite to a side the obverse surface faces as to the thickness direction, and the reverse surface is exposed out of the sealing resin.

REFERENCE SIGNS

A10, A20, A30, A40: Semiconductor device
11: Substrate
11A: Obverse surface
11B: Reverse surface
12: Base layer
13: Bonding layer
21: First lead
211: Pad portion
211A: Loading surface
211B: Opposing surface
211C: Peripheral edge
212: Terminal portion
213: First region
214: Second region
214A: Inner lateral surface
214B: Bottom surface
214C: Gap portion
22: Second lead
221: Pad portion
221A: Loading surface 221B: Opposing surface
221C: Base portion
221D: Oblique portion
222: Terminal portion
23: Third lead
24: Driver lead
241: Pad portion
242: Power supply portion
243: First control portion
244: Second control portion
245: Dummy portion
25: First gate terminal
26: Second gate terminal
27: First detection terminal
28: Second detection terminal
29: Temperature detection terminal
31: First semiconductor element
311: First electrode
312: Second electrode
313: Gate electrode
314: first peripheral edge
32: Second semiconductor element
321: First electrode
322: Second electrode
323: Gate electrode
324: Second peripheral edge
33: First driver
34: Second driver
35: Diode
36: Dummy element
37: Thermistor
39: Conductive bonding layer
41: First wire
42: Second wire
43: Third wire
44: Fourth wire
45: Fifth wire
50: Sealing resin
51: Top surface
52: Bottom surface
53: First lateral surface
54: Second lateral surface
55: Recession
60: Dummy lead
61: Wiring
D1: First dimension
D2: Second dimension
t1, t2: Thickness
B, b: Dimension
z: Thickness direction:
x: First direction
y: Second direction

The invention claimed is:

1. A semiconductor device, comprising:
a substrate having an obverse surface facing in a thickness direction;
a first lead having a loading surface facing a side same as a side the obverse surface faces as to the thickness direction and being fixed on the obverse surface; and
a first semiconductor element arranged on the loading surface,
wherein a dimension of the substrate in a first direction orthogonal to the thickness direction is larger than a dimension of the substrate in a second direction orthogonal to the thickness direction and the first direction, the first lead comprises a first region overlapped with the first semiconductor element as viewed in the thickness direction and a second region separated from the first semiconductor element as viewed in the thickness direction, and at least a part of the second region extends along the second direction,
a dimension of the second region in the first direction is smaller than a dimension of the first region in the first direction,
the first semiconductor element comprises a plurality of first semiconductor elements arranged in the first region, and
the plurality of first semiconductor elements are arranged on the first lead so that their positions in the second direction are different from one another.

2. The semiconductor device according to claim 1, wherein one end of the second region as to the second direction reaches a peripheral edge of the first lead.

3. The semiconductor device according to claim 1, wherein the first semiconductor element has a first peripheral edge extending along the second direction as viewed in the thickness direction, and
the first peripheral edge is adjacent to the second region in the first direction as viewed in the thickness direction.

4. The semiconductor device according to claim 3, further comprising two additional semiconductor elements separated from each other in the second direction,
wherein the second region has a gap portion located between the two additional semiconductor elements as viewed in the thickness direction.

5. The semiconductor device according to claim 1, wherein the dimension of the second region in the first direction is smaller than a dimension of the first semiconductor element in the first direction.

6. The semiconductor device according to claim 1, wherein the second region is a slit.

7. The semiconductor device according to claim 1, wherein the second region is a groove recessed from the loading surface.

8. The semiconductor device according to claim 1, wherein the first lead has an opposing surface opposed to the obverse surface, and
the second region is a groove recessed from the opposing surface.

9. The semiconductor device according to claim 1, further comprising a dummy element arranged on the loading surface and separated from the second region,
wherein the dummy element is located on a side the first semiconductor element is located with respect to the second region as to the first direction.

10. The semiconductor device according to claim 9, wherein the dummy element is adjacent to the first semiconductor element in the second direction.

11. The semiconductor device according to claim 1, further comprising:
a base layer laminated on the obverse surface; and
a bonding layer for bonding the base layer and the first lead,
wherein the base layer and the bonding layer contain a metallic element.

12. The semiconductor device according to claim 11, wherein the base layer contains silver, and
the bonding layer contains tin.

13. The semiconductor device according to claim 1, further comprising a conductive bonding layer for bonding the loading surface and the first semiconductor element, wherein the first semiconductor element is conducted to the first lead.

14. The semiconductor device according to claim 13, further comprising:

a second lead fixed on the obverse surface and separated from the first lead;

a second semiconductor element arranged on the second lead and conducted to the second lead, wherein the second lead is conducted to the first semiconductor element.

15. The semiconductor device according to claim 14, further comprising:

a third lead separated from the first lead and the second lead, wherein the third lead is conducted to the second semiconductor element.

16. The semiconductor device according to claim 1, further comprising a sealing resin for covering a part of each of the substrate and the first lead and the first semiconductor element, wherein the sealing resin is in contact with the second region.

17. The semiconductor device according to claim 16, wherein the substrate has a reverse surface facing a side opposite to a side the obverse surface faces as to the thickness direction, and the reverse surface is exposed out of the sealing resin.

18. A semiconductor device, comprising:

a substrate having an obverse surface facing in a thickness direction;

a first lead having a loading surface facing a side same as a side the obverse surface faces as to the thickness direction and being fixed on the obverse surface; and a first semiconductor element arranged on the loading surface, wherein a dimension of the substrate in a first direction orthogonal to the thickness direction is larger than a dimension of the substrate in a second direction orthogonal to the thickness direction and the first direction, the first lead comprises a first region overlapped with the first semiconductor element as viewed in the thickness direction and a second region separated from the first semiconductor element as viewed in the thickness direction, and at least a part of the second region extends along the second direction, a dimension of the second region in the first direction is smaller than a dimension of the first region in the first direction, and one end of the second region as to the second direction reaches a peripheral edge of the first lead.

19. A semiconductor device, comprising:

a substrate having an obverse surface facing in a thickness direction;

a first lead having a loading surface facing a side same as a side the obverse surface faces as to the thickness direction and being fixed on the obverse surface; and a first semiconductor element arranged on the loading surface, wherein a dimension of the substrate in a first direction orthogonal to the thickness direction is larger than a dimension of the substrate in a second direction orthogonal to the thickness direction and the first direction, the first lead comprises a first region overlapped with the first semiconductor element as viewed in the thickness direction and a second region separated from the first semiconductor element as viewed in the thickness direction, and at least a part of the second region extends along the second direction, a dimension of the second region in the first direction is smaller than a dimension of the first region in the first direction, and the second region is a slit.

\* \* \* \* \*